(12) United States Patent
Toyoda et al.

(10) Patent No.: US 8,088,486 B2
(45) Date of Patent: Jan. 3, 2012

(54) MICROENCAPSULATED PARTICULATE METAL MATERIAL, METHOD FOR PRODUCING THE SAME, AND AQUEOUS DISPERSION AND INK JET INK USING THE SAME

(75) Inventors: Naoyuki Toyoda, Suwa (JP); Toshiyuki Miyabayashi, Shiojiri (JP)

(73) Assignee: Seiko Epson Corporation (JP)

( * ) Notice: Subject to any disclaimer, the term of this patent is extended or adjusted under 35 U.S.C. 154(b) by 1325 days.

(21) Appl. No.: 11/407,401

(22) Filed: Apr. 19, 2006

(65) Prior Publication Data

US 2006/0240259 A1  Oct. 26, 2006

(30) Foreign Application Priority Data

Apr. 20, 2005 (JP) ................................. 2005-123029

(51) Int. Cl.
 *B32B 5/66* (2006.01)

(52) U.S. Cl. ..... 428/403; 428/407; 427/221; 427/407.1; 347/100

(58) Field of Classification Search .................. 428/403, 428/407; 427/221, 407.1; 347/100
See application file for complete search history.

(56) References Cited

U.S. PATENT DOCUMENTS

| | | | |
|---|---|---|---|
| 4,268,456 A | 5/1981 | Keim et al. | |
| 4,784,879 A | 11/1988 | Lee et al. | |
| 5,017,225 A | 5/1991 | Nakanishi et al. | |
| 7,119,133 B2 | 10/2006 | Vincent et al. | |
| 7,253,216 B2 * | 8/2007 | Miyabayashi | ................ 523/205 |
| 7,407,706 B2 * | 8/2008 | Miyabayashi et al. | ........ 428/407 |
| 7,423,076 B2 * | 9/2008 | Miyabayashi | ................ 523/205 |
| 2003/0170382 A1 | 9/2003 | Tomonari | |
| 2004/0157957 A1 | 8/2004 | Ganapathiappan et al. | |
| 2004/0229974 A1 | 11/2004 | Miyabayashi | |
| 2005/0075416 A1 | 4/2005 | Miyabayashi | |

FOREIGN PATENT DOCUMENTS

| | | |
|---|---|---|
| CA | 2 553 137 | 1/1998 |
| EP | 1 721 952 | 11/2006 |
| JP | 46-34898 | 10/1971 |
| JP | 49-46291 | 12/1974 |
| JP | 51-30284 | 3/1976 |
| JP | 55-011525 | 1/1980 |
| JP | 60-121201 | * 6/1985 |
| JP | 62-034947 | 2/1987 |
| JP | 62-104802 | 5/1987 |
| JP | 62-221431 | 9/1987 |
| JP | 1-24142 | 5/1989 |
| JP | 04-076004 | 3/1992 |
| JP | 4-65824 | 10/1992 |
| JP | 05-320276 | 12/1993 |
| JP | 10-316909 | 12/1998 |
| WO | WO 02/13999 | 2/2002 |

OTHER PUBLICATIONS

Goodman et al., "Surfactant Layering on Mixed Monolayer-Protected Gold Clusters" Colloids and Surfaces B: Biointerfaces 39, pp. 119-123 (2004).*

Catherine M. Goodman, et al., "Surfactant Layering on Mixed Monolayer-Protected Gold Clusters", Colloids and Surfaces B: Biointerfaces 39, pp. 119-123 (2004).

M.V. de Paz Banez, et al., "Synthesis of Novel Cationic Polymeric Surfactants", Polymer 41, pp. 8501-8511 (2000).

* cited by examiner

*Primary Examiner* — Leszek Kiliman

(74) *Attorney, Agent, or Firm* — Harness, Dickey & Pierce, P.L.C.

(57) ABSTRACT

A microencapsulated particulate metal material includes metal particles, a polymer coating the metal particles, and an ionic group provided on a surface of the polymer.

30 Claims, 5 Drawing Sheets

MICROENCAPSULATED PARTICULATE METAL MATERIAL, METHOD FOR PRODUCING THE SAME, AND AQUEOUS DISPERSION AND INK JET INK USING THE SAME

CROSS-REFERENCES TO RELATED APPLICATIONS

The entire disclosure of Japanese Patent Application No. 2005-123029, filed on Apr. 20, 2005, is expressly incorporated herein by reference.

BACKGROUND

1. Technical Field

The present invention relates to a microencapsulated particulate metal material for use in, for example, ink-jet metal wiring, and electronic equipment produced with the metal wiring, a method for producing the same, and an aqueous dispersion and an ink jet ink using the same.

2. Related Art

Metal particles such as metal nanoparticles and fine metal particles have been used, for example, for electrooptical apparatuses, conductive film wiring (metal wiring) of electronic equipment and coatings for films for use in display devices such as CRTs and liquid crystal displays.

For example, WO2002/013999 discloses a colloidal metal solution having a pH in the range of 8 to 14 and containing a low molecular weight sulfur compound present as a protective colloid on the surfaces of colloidal metal particles for the purpose of providing a colloidal metal solution of high concentration that has excellent dispersion stability with a small amount of a protective colloid in an industrially and economically advantageous manner, without an operation such as centrifugation.

Since metal particles such as these colloidal metal particles have high surface activity due to the quantum size effect, they fuse at low temperatures and tend to aggregate. For this reason, metal particles are generally stabilized for use by being coated with a dispersant on their surfaces. However, when metal particles are coated with a low molecular weight compound such as thiol, the ion tends to be eluted into the solvent, so that there is a fear that this ion may cause aggregation of the metal particles.

Further, semiconductors and other circuit elements are produced by forming circuit patterns, wiring patterns and other functional film patterns on silicon, glass, PET (polyethylene terephthalate) and other substrates. The pattern formation using ink jet technology is being used, since it enables formation of particularly minute film patterns and functional film patterns with a simplified process. When known metal particles are used for a metal particle ink for ink jet, the above-described problem may also arise and aggregation of the metal particles may reduce the adhesion of the particles to the substrate surface.

SUMMARY

An advantage of some aspects of the invention is to provide a microencapsulated particulate metal material for which aggregation of the metal particles has been suppressed by controlling elusion of the ions of the metal particles into a solvent and that has long-term storage stability, a method for producing the same, and an aqueous dispersion using the same.

Another advantage of some aspects of the invention is to provide an ink jet ink capable of improving the adhesion of the metal particles to the surface of a substrate by using a resin as a dispersant for coating the metal particles The above-described advantages can be achieved by the following aspects 1 to 37 of the invention.

1. A microencapsulated particulate metal material including metal particles, a polymer coating the metal particles, and an ionic group provided on a surface of the polymer.

2. A microencapsulated particulate metal material including metal particles having an anionic group on surfaces thereof and being coated with a polymer, the polymer including a repeating structural unit derived from a cationically polymerizable surfactant having a cationic group, a hydrophobic group and a polymerizable group.

3. A microencapsulated particulate metal material including metal particles having an anionic group on surfaces thereof and being coated with a polymer by polymerizing a cationically polymerizable surfactant having a cationic group, a hydrophobic group and a polymerizable group in an aqueous dispersion in which the metal particles are dispersed.

4. A microencapsulated particulate metal material including metal particles having an anionic group on surfaces thereof and being coated with a polymer, the polymer including a repeating structural unit derived from a cationically polymerizable surfactant having a cationic group, a hydrophobic group and a polymerizable group, and a repeating structural unit derived from an anionically polymerizable surfactant having a anionic group, a hydrophobic group and a polymerizable group and/or a hydrophilic monomer having an anionic group.

5. A microencapsulated particulate metal material including metal particles having an anionic group on surfaces thereof and being coated with a polymer by polymerizing a cationically polymerizable surfactant having a cationic group, a hydrophobic group and a polymerizable group and an anionically polymerizable surfactant having an anionic group, a hydrophobic group and a polymerizable group and/or a hydrophilic monomer having an anionic group in an aqueous dispersion in which the metal particles are dispersed.

6. The microencapsulated particulate metal material according to any one of the above 2 to 5, wherein the polymer further includes a repeating structural unit derived from a hydrophobic monomer.

7. The microencapsulated particulate metal material according to any one of the above 2 to 6, wherein the polymer further includes a repeating structural unit derived from a crosslinkable monomer and/or a repeating structural unit derived from a monomer represented by the following general formula (1):

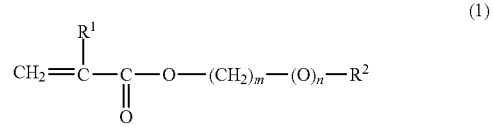

wherein $R^1$ represents a hydrogen atom or a methyl group, $R^2$ represents a t-butyl group, an alicyclic hydrocarbon group, an aromatic hydrocarbon group or a heterocyclic group, m represents an integer of 0 to 3, and n represents an integer of 0 or 1.

8. The microencapsulated particulate metal material according to any one of the above 1 to 7, wherein the metal constituting the metal particles is at least one selected from the group consisting of gold, silver, platinum, palladium and copper, and the metal particles have a low molecular weight sulfur compound on surfaces thereof.

9. The microencapsulated particulate metal material according to any one of the above 2 to 8, wherein the anionic group of the metal particles is a carboxylic acid anion group (—COO$^-$).

10. The microencapsulated particulate metal material according to any one of the above 2 to 8, wherein the anionic group of the metal particles is one selected from the group consisting of a sulfonic acid anion group (—SO$^{3-}$) and/or a sulfinic acid anion group (—RSO$^{2-}$: R represents an alkyl group having 1 to 12 carbon atoms, a phenylene group, or a modified group thereof).

11. The microencapsulated particulate metal material according to any one of the above 2 to 5, wherein the cationic group of the cationically polymerizable surfactant is one selected from the group consisting of a primary amine cation, a secondary amine cation, a tertiary amine cation and a quaternary ammonium cation.

12. The microencapsulated particulate metal material according to any one of the above 2 to 5, wherein the hydrophobic group of the cationically polymerizable surfactant is one selected from the group consisting of an alkyl group, an aryl group and a combined group thereof.

13. The microencapsulated particulate metal material according to any one of the above 2 to 5, wherein the polymerizable group of the cationically polymerizable surfactant is a radically polymerizable unsaturated hydrocarbon group selected from the group consisting of a vinyl group, an allyl group, an acryloyl group, a methacryloyl group, a propenyl group, a vinylidene group and a vinylene group.

14. A method for producing a microencapsulated particulate metal material by coating metal particles with a polymer, the method including: adding an ionic polymerizable surfactant and/or a hydrophilic monomer having an ionic group to an aqueous dispersion of the metal particles, followed by mixing; and adding thereto a polymerization initiator to perform emulsion polymerization.

15. A method for producing a microencapsulated particulate metal material by coating metal particles having an anionic group on surfaces thereof with a polymer, the method including: adding a cationically polymerizable surfactant having a cationic group, a hydrophobic group and a polymerizable group to an aqueous dispersion of the metal particles having an anionic group on surfaces thereof, followed by mixing; and adding thereto a polymerization initiator to perform emulsion polymerization.

16. A method for producing a microencapsulated particulate metal material by coating metal particles having an anionic group on surfaces thereof with a polymer, the method including: adding a cationically polymerizable surfactant having a cationic group, a hydrophobic group and a polymerizable group to an aqueous dispersion of the metal particles having an anionic group on surfaces thereof, followed by mixing; adding thereto a hydrophobic monomer and a cationically polymerizable surfactant to perform emulsification; and adding thereto a polymerization initiator to perform emulsion polymerization.

17. A method for producing a microencapsulated particulate metal material by coating metal particles having an anionic group on surfaces thereof with a polymer, the method including: adding a cationically polymerizable surfactant having a cationic group, a hydrophobic group and a polymerizable group to an aqueous dispersion of the metal particles having an anionic group on surfaces thereof, followed by mixing; adding thereto an anionically polymerizable surfactant having an anionic group, a hydrophobic monomer and a polymerizable group and/or a hydrophilic monomer having an anionic group to perform emulsification; and adding thereto a polymerization initiator to perform emulsion polymerization:

18. A method for producing a microencapsulated particulate metal material by coating metal particles having an anionic group on surfaces thereof with a polymer, the method including: adding a cationically polymerizable surfactant having a cationic group, a hydrophobic group and a polymerizable group to an aqueous dispersion of the metal particles having an anionic group on surface thereof, followed by mixing; adding thereto a hydrophobic monomer, followed by mixing; further adding thereto an anionically polymerizable surfactant having an anionic group, a hydrophobic group and a polymerizable group and/or a hydrophilic monomer having an anionic group to perform emulsification; and adding thereto a polymerization initiator to perform emulsification polymerization.

19. The microencapsulated particulate metal material according to the above 18, including:
adding a cationically polymerizable surfactant having a cationic group, a hydrophobic group and a polymerizable group to an aqueous dispersion of the metal particles having an anionic group on surfaces thereof, followed by mixing and treatment by irradiation with an ultrasonic wave;
adding a hydrophobic monomer, followed by mixing;
adding an anionically polymerizable surfactant having an anionic group, a hydrophobic group and a polymerizable group and/or a hydrophilic monomer having an anionic group, followed by mixing and treatment by irradiation with an ultrasonic wave; and
adding a polymerization initiator to perform emulsion polymerization,
wherein the above-referenced processes are carried out in this order.

20. The method for producing a microencapsulated particulate metal material according to the above 18, including:
adding a cationically polymerizable surfactant having a cationic group, a hydrophobic group and a polymerizable group to an aqueous dispersion of the metal particles having an anionic group on surfaces thereof, followed by mixing and treatment by irradiation with an ultrasonic wave;
adding a hydrophobic monomer, and a crosslinkable monomer and/or a monomer represented by the following general formula (1), followed by mixing;
adding an anionically polymerizable surfactant having an anionic group, a hydrophobic group and a polymerizable group and/or a hydrophilic monomer having an anionic group, followed by mixing and treatment by irradiation with an ultrasonic wave; and
adding a polymerization initiator to perform emulsion polymerization,
wherein the above-referenced processes are carried out in this order:

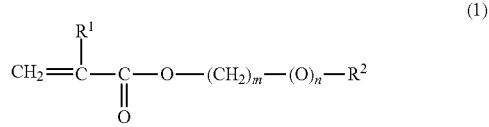

wherein R$^1$ represents a hydrogen atom or a methyl group, R$^2$ represents a t-butyl group, an alicyclic hydrocarbon group, an aromatic hydrocarbon group or a heterocyclic group, m represents an integer of 0 to 3, and n represents an integer of 0 or 1.

21. The method for producing a microencapsulated particulate metal material according to any of the above 14 to 20, wherein the metal constituting the metal particles is at least one selected from the group consisting of gold, silver, platinum, palladium and copper, and the metal particles have a low molecular weight sulfur compound on surfaces thereof.

22. An aqueous dispersion including the microencapsulated particulate metal material according to any of the above 1 to 13.

23. An ink jet ink including the aqueous dispersion according to the above 22.

24. The ink jet ink according to the above 23, which is produced by purification treatment of the aqueous dispersion, wherein the concentration of unreacted anionically polymerizable surfactant and/or hydrophilic monomer having an anionic group after the purification treatment is 50,000 ppm or lower based on the aqueous component in the aqueous dispersion.

25. The ink jet ink according to the above 23, which is produced by purification treatment of the aqueous dispersion, wherein the total concentration of unreacted anionically polymerizable surfactant and/or hydrophilic monomer having an anionic group, and unreacted hydrophobic monomer after the purification treatment is 50,000 ppm or lower based on the aqueous component in the aqueous dispersion.

26. The ink jet ink according to the above 23, which is produced by purification treatment of the aqueous dispersion, wherein the total concentration of unreacted cationically polymerizable surfactant, unreacted anionically polymerizable surfactant and/or hydrophilic monomer having an anionic group, and unreacted hydrophobic monomer after the purification treatment is 50,000 ppm or lower based on the aqueous component in the aqueous dispersion.

27. The ink jet ink according to the above 26, wherein each of the concentrations of unreacted cationically polymerizable surfactant, unreacted anionically polymerizable surfactant and/or hydrophilic monomer having an anionic group, and unreacted hydrophobic monomer before the purification treatment is 5 to 40% by weight based on individual charged amounts.

28. An ink jet ink including at least the microencapsulated particulate metal material according to any of the above 1 to 13 and water.

29. The ink jet ink according to any of the above 23 to 28, further including fine polymer particles having an anionic group on their surfaces, a glass transition temperature of 30° C. or lower and a volume average particle size of 10 to 200 nm.

30. The ink jet ink according to the above 29, wherein the anionic group on the surfaces of the fine polymer particles is the same as the anionic group on the surfaces of the metal particles of the microencapsulated particulate metal material.

31. The ink jet ink according to the above 29 or 30, wherein the fine polymer particles have such a reactivity with a divalent metal salt that the time required for decreasing the transmittance of light at a wavelength of 700 nm to 50% of the initial value is $1 \times 10^4$ seconds or less when 3 volumes of a 0.1% by weight of an aqueous emulsion thereof is brought into contact with 1 volume of a 1 mol/L aqueous solution of the divalent metal salt.

32. The ink jet ink according to any of the above 23 to 31, further including a water-soluble organic solvent.

33. The ink jet ink according to the above 32, wherein the water-soluble organic solvent is a high boiling water-soluble organic solvent having a boiling point of 180° or higher.

34. The ink jet ink according to the above 32 or 33, wherein the water-soluble organic solvent is glycerin.

35. The ink jet ink according to the above 32 or 33, wherein the water-soluble organic solvent is at least one compound selected from the group consisting of an alkyl ether of a polyhydric alcohol and 1,2-alkyldiol.

36. The ink jet ink according to any of the above 23 to 35, further including a solid wetting agent in an amount of 3% by weight to 20% by weight based on the total weight of the ink jet ink.

37. The ink jet ink according to the above 36, wherein the solid wetting agent is at least one compound selected from the group consisting of trimethylolpropane, 1,2,6-hexanetriol, a saccharide and a sugar alcohol.

With the invention, it is possible to realize a microencapsulated particulate metal material for which aggregation of the metal particles have been suppressed by controlling elusion of the ions of the metal particles into a solvent and that has long-term storage stability, a method for producing the same, and an aqueous dispersion using the same.

Furthermore, with the invention, it is possible to realize an ink jet ink capable of improving the adhesion of metal particles to the surface of a substrate.

DESCRIPTION OF EXEMPLARY EMBODIMENTS

Figure 1:
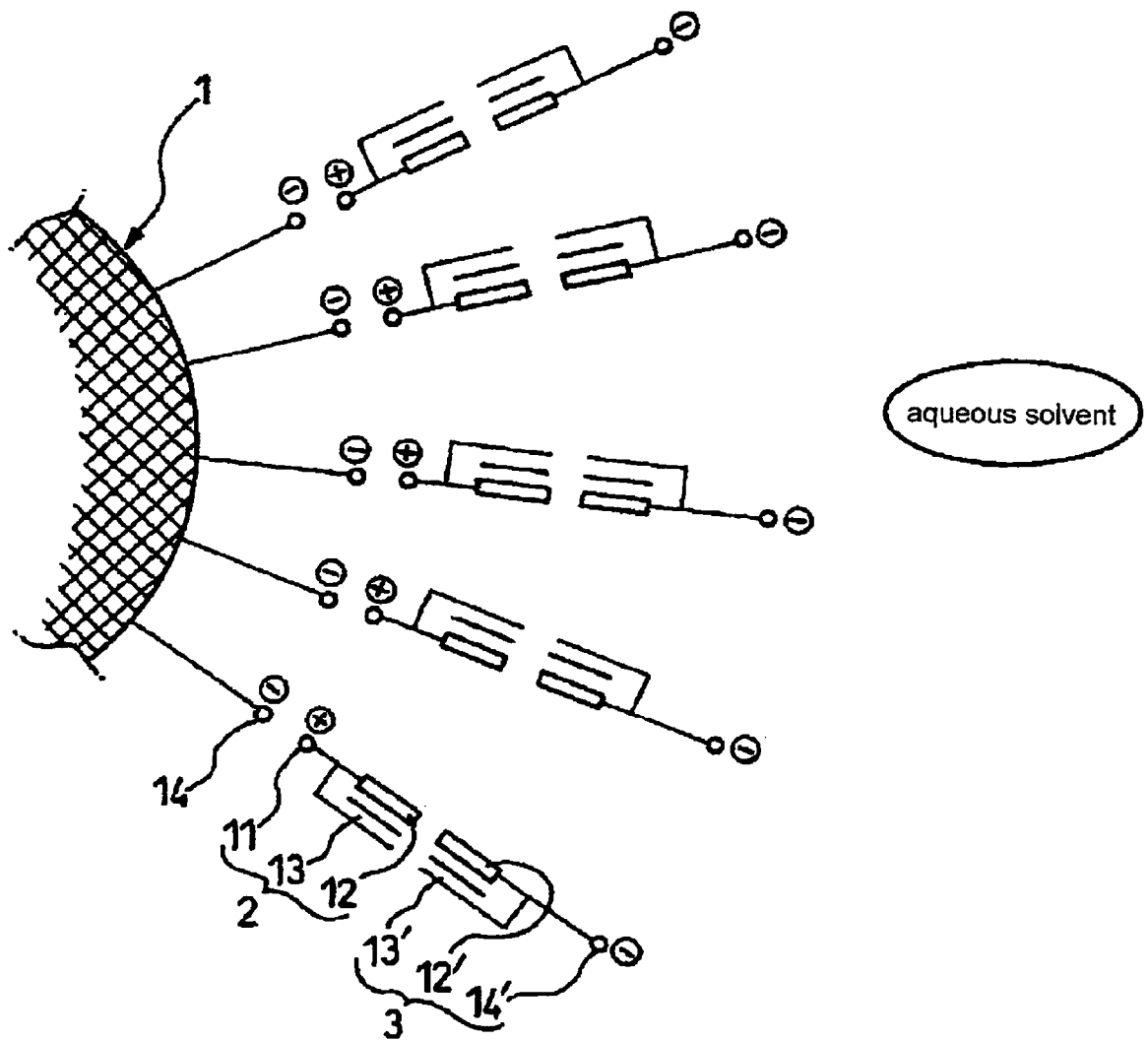
FIG. 1 is a schematic view showing a state in which a metal particle having an anionic group on its surface is dispersed in an aqueous solvent, and is coexistent with a cationically polymerizable surfactant and an anionically polymerizable surfactant.

A microencapsulated particulate metal material according to one preferred embodiment of the invention includes metal particles having an anionic group on their surfaces and being coated with a polymer, and the polymer has a repeating structural unit derived from a cationically polymerizable surfactant having a cationic group, a hydrophobic group and a polymerizable group, and a repeating structural unit derived from an anionically polymerizable surfactant having an anionic group, a hydrophobic group and a polymerizable group and/or a hydrophilic monomer having an anionic group.

Such a microencapsulated particulate metal material can be preferably produced by a method for producing a microencapsulated particulate metal material by coating metal particles having an anionic group on their surfaces with a polymer, and the method includes: adding the cationically polymerizable surfactant to an aqueous dispersion of the metal particles having an anionic group on their surfaces, followed by mixing; and adding thereto the anionically polymerizable surfactant and/or the hydrophilic monomer having an anionic group to achieve emulsification; and adding thereto a polymerization initiator to perform emulsion polymerization. In such an emulsion polymerization, the anionic group on the surface of the metal particles having an anionic group on their surfaces is first ionically bonded to the cationic group of the cationically polymerizable surfactant, thereby forming a structure in which the hydrophobic group of this cationically polymerizable surfactant and the hydrophobic group of the anionically polymerizable surfactant face each other, while the anionic group of the anionically polymerizable surfactant is orientated toward an aqueous phase side. When polymerization reaction is performed in this state, a polymer layer maintaining the above-mentioned structure is formed on the surface of the metal particles. That is to say, the form of arrangement of the cationically polymerizable surfactant ant the anionically polymerizable surfactant being present around the metal particles before the polymerization reaction is extremely highly controlled, and in the outermost shell, a state is created in which the anionic group is orientated toward the aqueous phase. Then, the cationically polymerizable surfactant and the anionically polymerizable surfactant are converted to the polymer by emulsion polymerization reaction, with this highly controlled form maintained. Accordingly, the microencapsulated particulate metal material of the invention becomes a particulate metal material whose structure is controlled to very high accuracy.

Thus, the microencapsulated particulate metal material according to the embodiment of the invention can achieve the following effects:

(1) capable of controlling elution of the ions of the metal particles into a solvent;

(2) capable of suppressing aggregation of the metal particles;

(3) capable of providing long-term storage stability; and (4) in the case of forming ink-jet metal wiring for electronic equipment and the like, capable of improving the adhesion of the metal particles to the surface of a substrate by using a resin as a dispersant for coating the metal particles.

With conventionally used microencapsulated particulate metal materials in which metal particles are coated with a polymer previously prepared by using, for example, phase inversion emulsification or acid precipitation, it seems that such a state of metal particles coated with the polymer that satisfies the above-mentioned effects of the invention has not been achieved, presumably because the fact that the polymer has been previously prepared limits the state of the metal particles coated with the polymer.

Here, it is preferred that the metal particles of the microencapsulated particulate metal material have an aspect ratio (elongation degree) of 1.0 to 1.3, and a Zingg index of 1.0 to 1.3, more preferably 1.0 to 1.2. This makes it possible to satisfy the above-mentioned effects more reliably.

When the minor diameter, major diameter and thickness of a particle are taken as b, l and t ($l \geq b \geq t \geq 0$), respectively, the aspect ratio (elongation degree) is $l/b$ ($\geq 1$), the degree of flatness is $b/t$ ($\geq 1$), and the Zingg index is the elongation degree/the degree of flatness=$(l \cdot t)/b^2$. That is to say, the true sphere has an aspect ratio of 1 and a Zingg index of 1.

When the Zingg index is greater than 1.3, the microencapsulated particulate metal material becomes flatter in shape to lower the isotropy. This presumably accounts for the fact that there is a tendency to fail to obtain sufficient results, with respect to the above-described effects. Although there is no particular limitation on the method for adjusting the aspect ratio and the Zingg index within the above-mentioned ranges, the microencapsulated particulate metal material obtained by coating the metal particles having an anionic group on their surfaces with the polymer by the above-mentioned emulsion polymerization method can easily satisfy these conditions.

As for conventionally used microencapsulated particulate metal materials prepared by methods other than the emulsion polymerization method, such as acid precipitation and phase inversion emulsification, it is difficult to adjust the aspect ratio and the Zingg index within the above-mentioned ranges. When the aspect ratio and Zingg index of the metal particles of the microencapsulated particulate metal material are within the above-mentioned ranges, the metal particles have the shape of a true sphere. Accordingly, an ink easily becomes Newtonian in its fluid characteristics, resulting in excellent ejection stability. Further, the metal particles are excellent in dispersibility and dispersion stability because of their true sphere shape.

Embodiments of the invention will be described in detail below, with reference to dispersed states of metal particles that can occur in the above-mentioned preferred method. However, the dispersed states of the metal particles described below include assumptions.

FIG. 1 is a view showing a state in which a metal particle 1 having an anionic group 14 as a hydrophilic group on its surface is dispersed in a solvent containing water as a main component (hereinafter also referred to as "aqueous solvent") and is coexistent with a cationically polymerizable surfactant 2 having a cationic group 11, a hydrophobic group 12 and a polymerizable group 13, and an anionically polymerizable surfactant 3 having an anionic group 14', a hydrophobic group 12' and a polymerizable group 13'. The cationically polymerizable surfactant 2 is arranged so that its cationic group 11 is directed toward the anionic group 14 of the metal particle 1, and adsorbed by a strong ionic bond. Then, the hydrophobic group 12' and the polymerizable group 13' of the anionically polymerizable surfactant 3 are directed toward the hydrophobic group 12 and the polymerizable group 13 of the cationically polymerizable surfactant 2 by a hydrophobic interaction. The other anionic group 14' of the anionically polymerizable surfactant 3 is directed toward a direction in which the aqueous solvent is present, i.e., a direction away from the metal particle 1.

Figure 2:
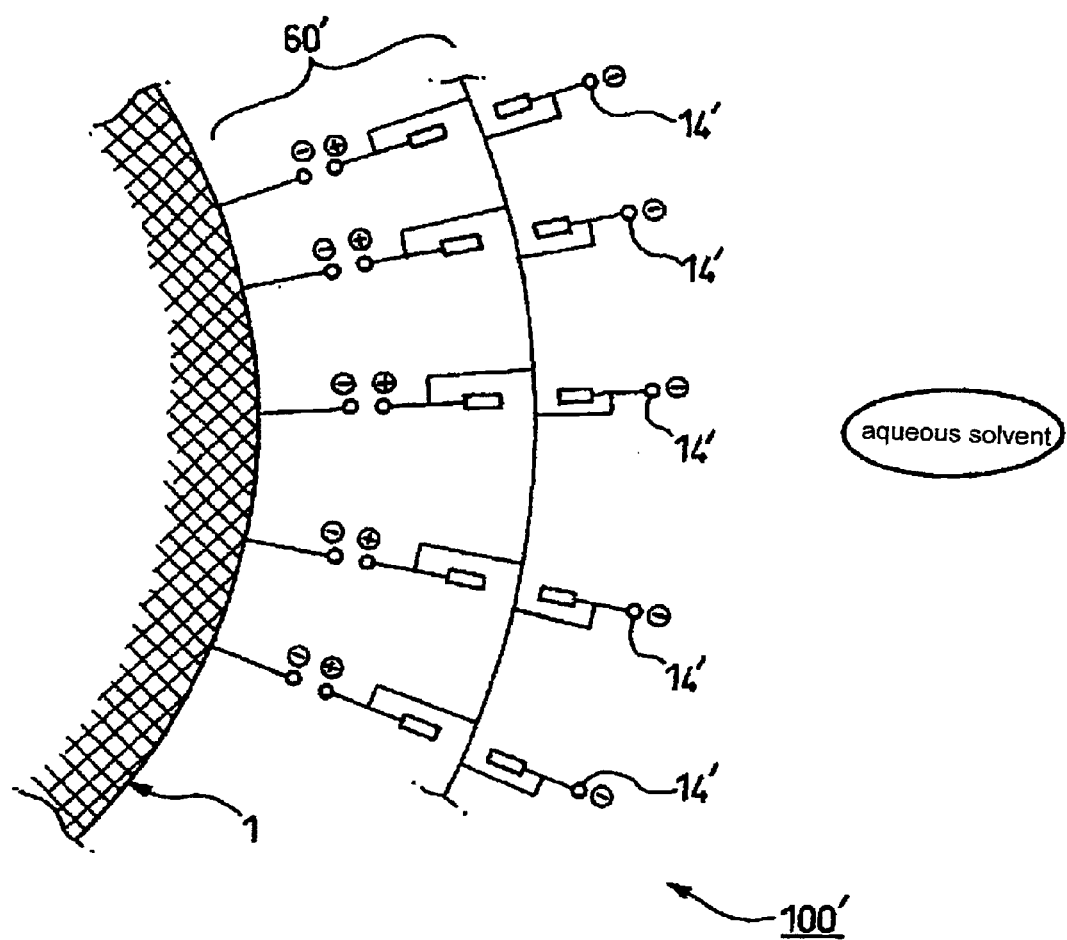
FIG. 2 is a schematic view showing a state in which the cationically polymerizable surfactant and the anionically polymerizable surfactant are polymerized in the dispersed state shown in FIG. 1.

To such an aqueous dispersion, for example, a polymerization initiator is added to polymerize the polymerizable groups 13 of the cationically polymerizable surfactant 2 and the polymerizable groups 13' of the anionically polymerizable surfactant 3, thereby preparing a microencapsulated metal particle 100' in which the metal particle 1 is coated with a polymer layer 60', as shown in FIG. 2. The polymer layer 60' has the anionic groups 14' on its surface, so that the microencapsulated metal particle 100' is dispersible in the aqueous solvent. When a hydrophilic monomer having an anionic group as a hydrophilic group is used in place of the above-mentioned anionically polymerizable surfactant 3, the microencapsulated metal particle can also be produced in a similar manner. If necessary, a comonomer copolymerizable with the cationically polymerizable surfactant, the anionically polymerizable surfactant and/or the hydrophilic monomer having an anionic group may be present in the aqueous dispersion at the time of polymerization. In that case, the polymer layer may be a copolymer layer obtained by copolymerizing the cationically polymerizable surfactant, the anionically polymerizable surfactant and/or hydrophilic monomer having an anionic group and the comonomer.

Figure 3:
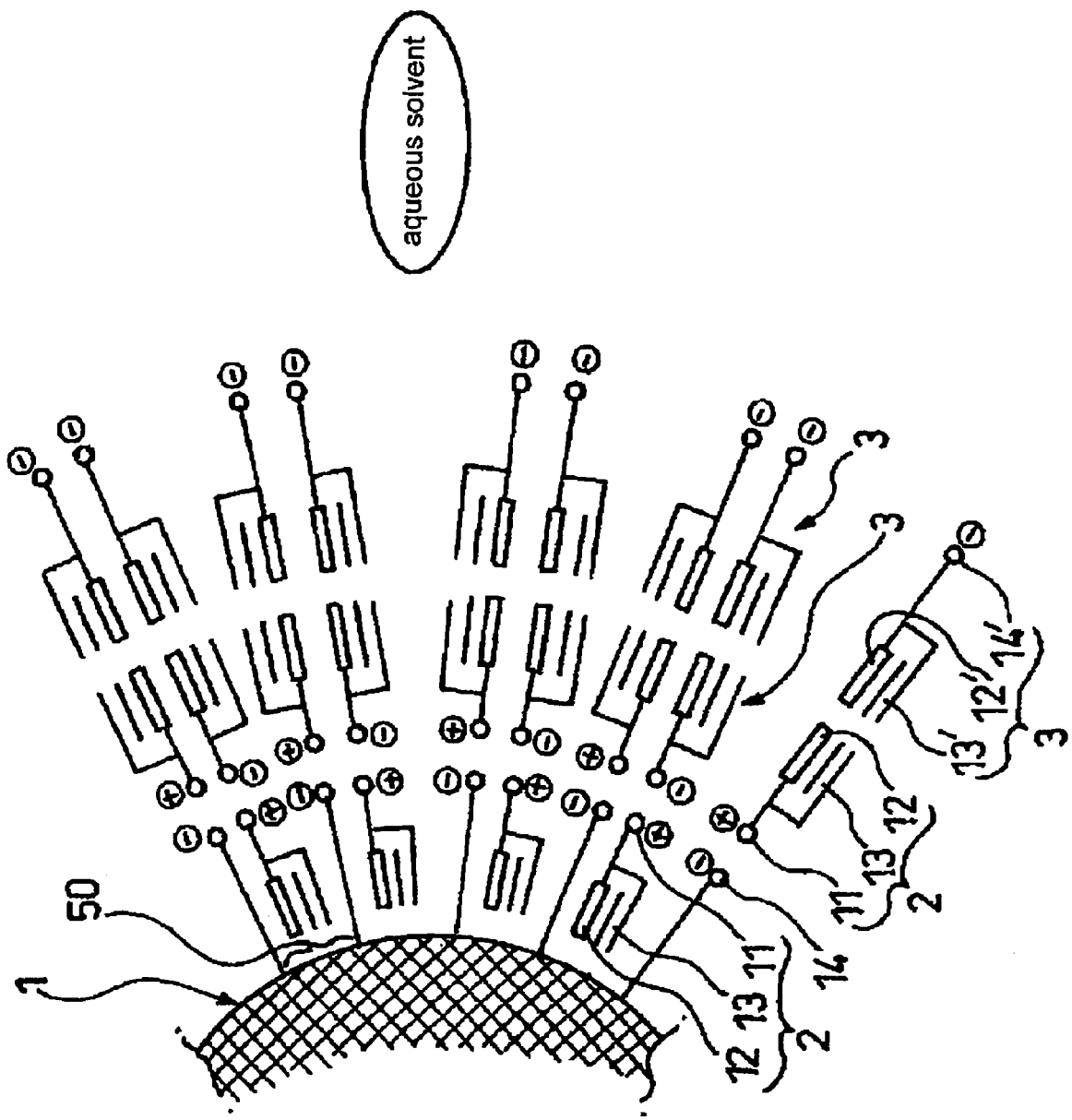
FIG. 3 is a schematic view showing a state in which a metal particle having an anionic group on its surface is dispersed in an aqueous medium, and is coexistent with a cationically polymerizable surfactant and an anionically polymerizable surfactant.

Further, in addition to the above, a dispersed state of the metal particles that can occur in the above-mentioned preferred method will be described. FIG. 3 is a view showing a state in which a metal particle 1 having an anionic group 14 as a hydrophilic group on its surface is dispersed in a solvent containing water as a main component (hereinafter also referred to as "aqueous solvent"), and is coexistent with a cationically polymerizable surfactant 2 having a cationic group 11, a hydrophobic group 12 and a polymerizable group 13, and an anionically polymerizable surfactant 3 having an anionic group 14', a hydrophobic group 12' and a polymerizable group 13'. The cationically polymerizable surfactant 2 is arranged so that its cationic group 11 is directed toward the anionic group 14 of the metal particle 1, and adsorbed by a strong ionic bond. Then, the hydrophobic group 12' and the polymerizable group 13' of the anionically polymerizable surfactant 3 are directed toward the hydrophobic group 12 and the polymerizable group 13 of this cationically polymerizable surfactant 2 by a hydrophobic interaction. The anionic group 14' of another anionically polymerizable surfactant 3 is directed toward a direction in which the aqueous solvent is present, i.e., a direction away from the metal particle 1.

Further, the metal particle 1 has, on its surface, the anionic groups 14 chemically bonded thereto at a specific density, and hydrophobic regions 50 between the anionic groups 14. For example, the hydrophobic group 12 and the polymerizable group 13 of the cationically polymerizable surfactant 2 are directed toward the hydrophobic region 50. Then, the anionically polymerizable surfactant 3 is arranged so that its anionic group 14' is directed toward the cationic group 11 of this cationically polymerizable surfactant 2, and adsorbed by a strong ionic bond. Toward the hydrophobic group 12' and the polymerizable group 13' of this anionically polymerizable surfactant 3, the hydrophobic group 12' and the polymerizable group 13' of another anionically polymerizable surfactant 3 are directed by a hydrophobic interaction, and the anionic group 14' of this anionically polymerizable surfactant 3 is directed toward a direction in which the aqueous solvent is present, i.e., a direction away from the metal particle 1.

Figure 4:
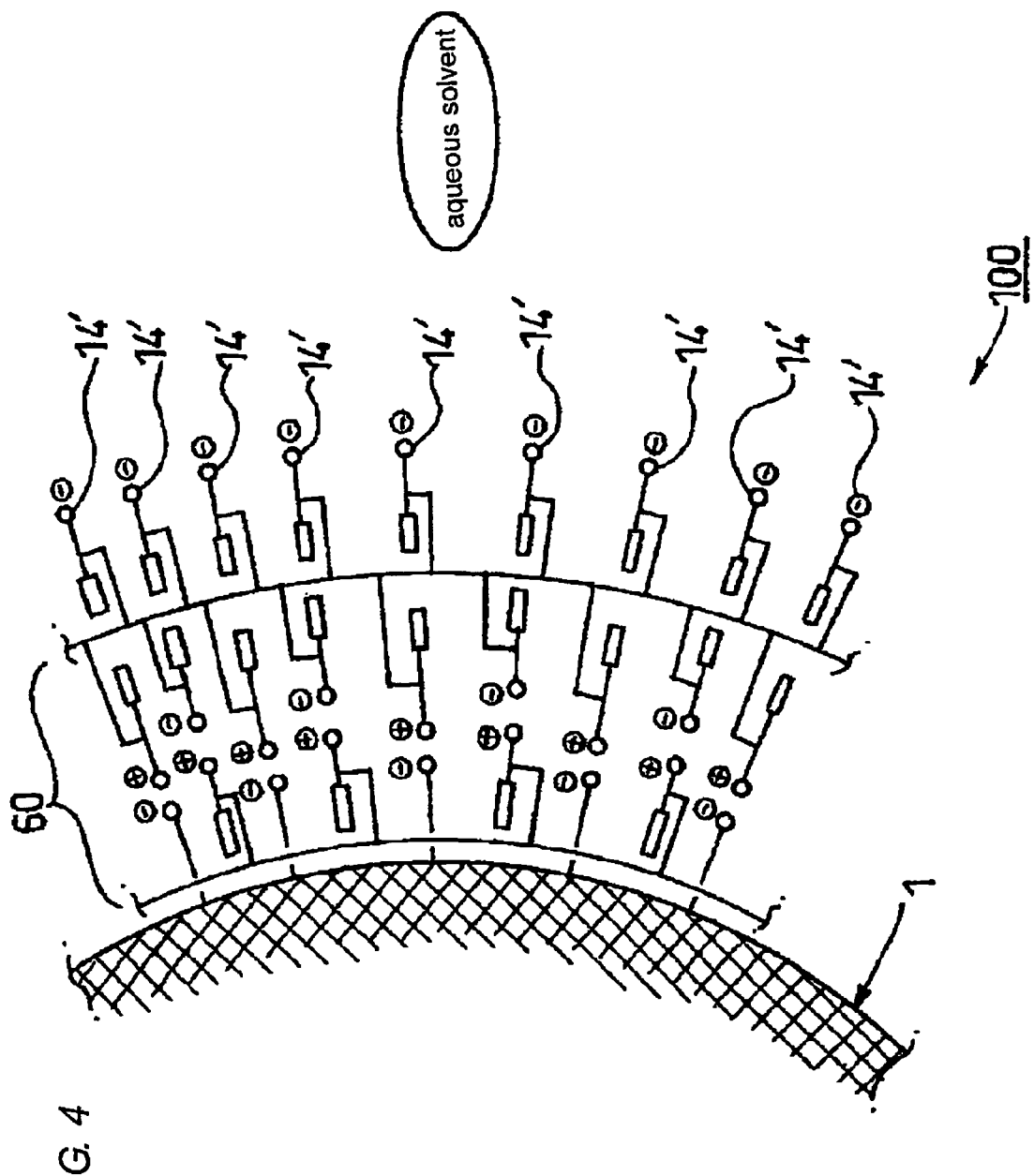
FIG. 4 is a schematic view showing a state in which the cationically polymerizable surfactant and the anionically polymerizable surfactant are polymerized in the dispersed state shown in FIG. 3.

To such an aqueous dispersion, for example, a polymerization initiator is added to polymerize the polymerizable group 13 of the cationically polymerizable surfactant 2 and the polymerizable group 13' of the anionically polymerizable surfactant 3, thereby preparing a microencapsulated metal particle 100 in which the metal particle 1 is coated with a polymer layer 60, as shown in FIG. 4. The polymer layer 60 has, on its surface, the anionic groups 14', so that the microencapsulated metal particle 100 is dispersible in the aqueous solvent. When a hydrophilic monomer having an anionic group as a hydrophilic group is used in place of the above-mentioned anionically polymerizable surfactant 3, the microencapsulated metal article can also be produced in a similar manner. If necessary, a comonomer polymerizable with the cationically polymerizable surfactant, the anionically polymerizable surfactant and/or the hydrophilic monomer having an anionic group may be present in the aqueous dispersion at the time of polymerization. In that case, the polymer layer can be a copolymer layer obtained by copolymerizing the cationically polymerizable surfactant, the anionically polymerizable surfactant and/or the hydrophilic monomer having an anionic group and the comonomer.

Examples of the dispersed states have been described above with reference to the drawings, in which first, the metal particles 1 have an anionic group on their surfaces as a hydrophilic group, and thus are in a state in which they are dispersed in the aqueous solvent. The metal particles 1 are more highly dispersed in the aqueous dispersion compared to the case where metal particles having no hydrophilic groups (anionic groups) on their surfaces are dispersed with a dispersant. With such a microencapsulated particulate metal material in which the metal particles having an anionic group on their surfaces are coated with the polymer, the anionic groups on the surface of the microencapsulated particulate metal material are regularly and densely orientated toward a direction in which the aqueous solvent is present, as shown in FIGS. 2 and 4. Accordingly, dispersion stability of the microencapsulated particulate metal material in the aqueous medium can be improved. Consequently, when the microencapsulated particulate metal material according to the invention is used as the metal particles for an ink jet ink and the aqueous solvent is used as a solvent for the ink, even in the case where the microencapsulated particulate metal material is contained in larger weight amounts in the ink, dispersion stability more excellent than that of conventional microencapsulated particulate metal material inks can be obtained, while maintaining a low viscosity without the occurrence of aggregation of the metal particles and an increase in viscosity. The microencapsulated particulate metal material excellent in dispersion stability has less fear of clogging nozzles of an ink jet head, so that ejection stability is also improved. That is to say, the microencapsulated particulate metal material ink can be prepared which is excellent in dispersion stability and ejection stability, and also improved in the content (weight concentration) of the metal particles compared to the conventional microencapsulated particulate metal material inks.

It seems that the microencapsulated particulate metal material of the invention has a small particle size, and that the hydrophilic groups (in particular, anionic groups) on the surface of the particles are regularly and densely orientated toward the aqueous phase side, so that effective electrostatic repulsion seems to be generated between the metal particles of the microencapsulated particulate metal material. Further, in addition to such electrostatic repulsion, an effect of steric hindrance due to the polymer with which the metal particles are coated (polymer effect) seems to contribute excellent dispersion stability of the microencapsulated particulate metal material of the invention in the aqueous medium.

Next, constituents of the microencapsulated particulate metal material according to the invention will be described in detail below.

The metal particles having hydrophilic groups on their surfaces can be suitably prepared by treating the surfaces of the metal particles, such as metal nanoparticles or colloidal metal particles, with a hydrophilic group-imparting agent. Accordingly, there is no particular limitation on the metal constituting the metal particles having hydrophilic groups on their surfaces, as long as it is a metal that is insoluble in the hydrophilic group-imparting agent. From such a viewpoint, examples of the metal preferably used in the ink of the invention include the following metals.

As the metal constituting the metal particles, at least one selected from the group consisting of Group 8 metals (iron, cobalt, nickel, ruthenium, rhodium, palladium, osmium, iridium and platinum) and Group 1B metals (copper, silver and gold) of the periodic table can be used in many applications. In particular, gold, silver, platinum, palladium and copper are more preferred due to their excellent conductivity, for example. Furthermore, the metal particles may be constituted by an alloy made of two or more of the above-mentioned metals, or a mixture of two or more of kinds of these metals may be used for the metal particles. The metal particles have an average particle size of about 1 to 100 nm. Metal particles having an average particle size in the range of 5 to 50 nm is preferred due to the excellent transparency.

In order to provide anionic groups as hydrophilic groups on the surfaces of the metal particles, it is necessary to treat the surfaces with a surface treating agent or dispersant, such as a surfactant having a carboxylic acid and/or sulfonic acid group, and/or a sulfinic acid group. The surfactant is preferably constituted by metal particles having a sulfur compound on their surfaces, since they can provide an improved stabilizing effect. Further, examples of such a sulfur compound include mercaptoacetic acid, mercaptopropionic acid, thiodipropionic acid, mercaptosuccinic acid, thiodiglycolic acid, thiocarbonic acid, mercaptobutanoic acid, mercaptopentanoic acid, mercaptohexanoic acid, mercaptoheptanoic acid, mercaptooctanoic acid, mercaptononanoic acid, mercaptodecanoic acid, mercaptoundecanoic acid, and their salts and derivatives. At least one selected from these sulfur compounds can be used. Of these sulfur compounds, thiol compounds (i.e., compounds in which the hydrogen atom of an aliphatic hydrocarbon is substituted with an SH group and that are represented by the general formula RSH (R represents an alkyl group or the like) are preferred, since they have high affinity for the metal particles and provide good protective colloid action. Mercaptoacetic acid, mercaptopropionic acid and mercaptoethanol are particularly preferred.

The treatment using a sulfur-containing treating agent is performed by dispersing the metal particles in a solvent, and adding the sulfur-containing treating agent to this dispersion, and heating the mixture to 60 to 200° C., followed by stirring for 3 to 10 hours. Specifically, it is preferable to employ a method in which the metal particles are dispersed in advance by high speed shearing using a high-speed mixer or the like, or dispersed by impact using a bead mill, a jet mill or the like, to form a slurry (dispersion). Thereafter, moderate stirring is performed, and then the sulfur-containing treating agent is added to introduce hydrophilic groups on the surfaces of the metal particles. At this time, the amount of hydrophilic groups introduced is determined largely by the reaction conditions and the type of the sulfur-containing treating agent. After the subsequent heating, the solvent and the residual sulfur-containing treating agent are removed from the slurry of the metal particles. The removal is carried out by repeatedly performing a process such as water washing, ultrafiltration, reverse osmosis, centrifugal separation or filtration.

Then, the metal particles are mixed with hypohalite, such as sodium hypochlorite, having an effective concentration of halogen of 10 to 30% in a suitable amount of water, and the mixture is heated to 60 to 80° C., followed by stirring for about 5 to 10 hours, preferably 10 hours or longer. This operation involves a considerable amount of heat generation, and therefore requires safety precautions. In addition, a desired aqueous dispersion can be obtained by repeatedly performing a process such as water washing, ultrafiltration, reverse osmosis, centrifugal separation or filtration, as needed.

By treating metal particles having a carboxylic acid group (—COOH) with an alkaline compound, it is possible to produce metal particles having a carboxylic acid anion group (—COO$^-$) as a hydrophilic group on their surfaces. In this invention, metal particles in this state are preferably used. The type of the alkaline compound and the treating method using the alkaline compound are the same as described above.

As the alkaline compound, an alkaline compound in which the cation is an alkali metal ion or a monovalent ion represented by the chemical formula $(R_1R_2R_3R_4N)^+$ ($R_1$, $R_2$, $R_3$ and $R_4$ may be the same or different, and represent a hydrogen atom, an alkyl group, a hydroxyalkyl group or a halogenated alkyl group) may be selected. Preferably, the alkaline compound is an alkaline compound in which the cation is a lithium ion ($Li^+$), potassium ion ($K^+$), a sodium ion ($Na^+$), an ammonium ion ($NH_4^+$) or an alkanolamine cation such as a triethanolamine cation.

As the anion of the alkaline compound, hydroxide anion can be preferably used, and specific examples thereof include ammonia, alkanolamine (e.g., monoethanolamine, diethanolamine, N,N-butylethanolamine, triethanolamine, propanolamine, aminomethylpropanol and 2-aminoisopropanol), and hydroxides of monovalent alkali metals (LiOH, NaOH and KOH).

The amount of the above-described alkaline compounds added is preferably equal to or more than the neutralization equivalent of the carboxylic acid and/or sulfonic acid group, and/or the sulfinic acid group of the metal particles. Furthermore, the volatile additives, such as ammonia and alkanolamine, are added preferably in an amount approximately equal to or more than 1.5 times the neutralization equivalent.

It should be noted that the operation can be performed by introducing the above-described metal particles having a carboxylic acid and/or sulfonic acid group, and/or a sulfinic acid group chemically bonded on their surfaces into the alkaline compound, and shaking the whole using a paint shaker or the like.

The metal particles having a hydrophilic group on their surfaces have been described above in detail. The average particle size of the metal particles having a hydrophilic group on their surfaces can be easily adjusted to 150 nm or less by the above-described production methods. In particular, the average particle size of the metal particles having a hydrophilic group on their surfaces is preferably adjusted to 20 nm to 80 nm by selecting, for example, the type of the metal particles or the hydrophilic group-imparting agent and the amount of the hydrophilic group introduced. This makes it possible to obtain a microencapsulated particulate metal material that allows more reliable production of an ink jet recording ink excellent in dispersion stability and ejection stability. In this specification, the description of the average particle size is based on measurements obtained by the laser light scattering method.

The metal particles having a hydrophilic group on their surfaces are subsequently coated with the polymer including a repeating structural unit derived from the cationically polymerizable surfactant having a cationic group, a hydrophobic group and a polymerizable group, and a repeating structural unit derived from the anionically polymerizable surfactant having an anionic group, a hydrophobic group and a polymerizable group and/or a hydrophilic monomer having an anionic group, thereby producing the microencapsulated particulate metal material according to one embodiment of the invention. Such a microencapsulated particulate metal material can be suitably prepared by adding the cationically polymerizable surfactant to an aqueous dispersion of the metal particles having an anionic group on their surfaces, followed by mixing, then, further adding the anionically polymerizable surfactant and/or the hydrophilic monomer having an anionic group to achieve emulsification, and then, adding a polymerization initiator to perform emulsion polymerization, as described above.

Preferably, the cationic group of the cationically polymerizable surfactant is one selected from the group consisting of a primary amine cation, a secondary amine cation, a tertiary amine cation and a quaternary ammonium cation. Examples of the primary amine cation include a monoalkylammonium cation ($RNH_3^+$), those of the secondary amine cation include a dialkylammonium cation ($R_2NH_2^+$), those of the tertiary amine cation include a trialkylammonium cation ($R_3NH^+$), and those of the quaternary ammonium cation include ($R_4N^+$). Here, R represents a hydrophobic group or a polymerizable group, and examples thereof include the following. Examples of the counter anion of the above-mentioned cationic group include Cl⁻, Br⁻ and I⁻. The hydrophobic group is preferably selected from the group consisting of an alkyl group, an aryl group and a combined group thereof. The polymerizable group is preferably an unsaturated hydrocarbon group, and more specifically, one selected from the group consisting of a vinyl group, an allyl group, an acryloyl group, a methacryloyl group, a propenyl group, a vinylidene group and vinylene group. Of these, an acryloyl group and a methacryloyl group are particularly preferred examples.

Specific examples of the above-described cationically polymerizable surfactant include a cationic allylic acid derivative as described in JP-B4-65824.

Examples of the cationically polymerizable surfactant used in this invention include a compound represented by a general formula $R_{[4-(l+m+n)]}R^1{}_lR^2{}_mR^3{}_nN^+ \cdot X^-$ (R is a polymerizable group, $R^1$, $R^2$ and $R^3$ are each an alkyl group or aryl group, X is Cl, Br or I, and l, m and n are each 1 or 0). Here, preferred examples of the above-described polymerizable group include hydrocarbon groups having radically polymerizable unsaturated hydrocarbon groups, and specific examples thereof includes an allyl group, an acryloyl group, a methacryloyl group, a vinyl group, a propenyl group, a vinylidene group and vinylene group.

Specific examples of the cationically polymerizable surfactant include methacrylic acid dimethylaminoethylmethyl chloride, methacrylic acid dimethylaminoethylbenzyl chloride, methacryloyloxyethyltrimethylammonium chloride, diallyldimethylammonium chloride and 2-hydroxy-3-methacryloxypropyltrimethylammonium chloride.

As the above-described cationically polymerizable surfactant, a commercially available product may be used. Examples thereof include Acryester DMC (Mitsubishi Rayon Co., Ltd.), Acryester DML60 (Mitsubishi Rayon Co., Ltd.) and C-1615 (Daiichi Kogyo Seiyaku Co., Ltd.).

The cationically polymerizable surfactants shown above as examples can be used either alone or in combination of two or more of them.

The amount of the cationically polymerizable surfactant added is preferably within the range of 0.5 to 2 times the total molarity of the anionic groups based on the amount of the metal particles having an anionic group on their surfaces used (the weight of the metal particles used (g)×the anionic group amount on the surfaces of the metal particles (mol/g), more preferably within the range of 0.8 to 1.2 times the molarity thereof. By adjusting the amount added to 0.5 time the molarity or more, the cationically polymerizable surfactant is ionically strongly bonded to the metal particles having an anionic group as the hydrophilic group, thus making it possible to perform encapsulation easily. By adjusting the amount added to 2 times the molarity or less, the occurrence of a cationically polymerizable surfactant not adsorbed on the metal particles can be reduced, and the occurrence of a polymer particle having no metal particle as the core material (a particle composed only of the polymer) can be prevented.

Specific examples of the anionically polymerizable surfactant include anionic allyl derivatives as described in JP-B49-46291, JP-B-1-24142 and JP-A-62-104802, anionic propenyl derivatives as described in JP-A-62-221431, anionic acrylic acid derivatives as described in JP-A-62-34947 and JP-A-55-11525, and anionic itaconic acid derivatives as described in JP-B46-34898 and JP-A-51-30284.

Examples of the anionically polymerizable surfactant used in the invention include a compound represented by general formula (31):

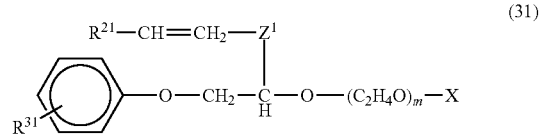

wherein $R^{21}$ and $R^{31}$ are each independently a hydrogen atom or a hydrocarbon group having 1 to 12 carbon atoms; $Z^1$ is a group represented by a carbon-carbon single bond or a formula —CH₂—O—CH₂—; m is an integer of 2 to 20; and X is a group represented by a formula —SO₃M¹, wherein M¹ is an alkali metal, an ammonium salt or an alkanolamine; and a compound represented by general formula (32):

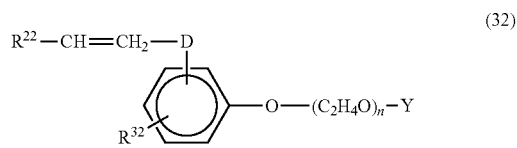

wherein $R^{22}$ and $R^{32}$ are each independently a hydrogen atom or a hydrocarbon group having 1 to 12 carbon atoms; D is a group represented by a carbon-carbon single bond or a formula —CH₂—O—CH₂—; n is an integer of 2 to 20; and Y is a group represented by a formula —SO₃M², wherein M² is an alkali metal, an ammonium salt or an alkanolamine.

The polymerizable surfactants represented by the above-mentioned formula (31) are described in JP-A-5-320276 and JP-A-10-316909. By appropriately adjusting the kind of $R^{21}$ and the value of X in formula (31), the polymerizable surfactants can be made in conformity with the degree of hydrophilicity or hydrophobicity of the surface of the metal particles. Preferred examples of the polymerizable surfactant represented by formula (31) include a compound represented by the following formula (310), and specific examples thereof include compounds represented by the following formulas (31a) to (31d):

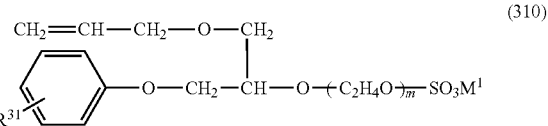

wherein $R^{31}$, m and M¹ are the same as those given for the compound represented by formula (31);

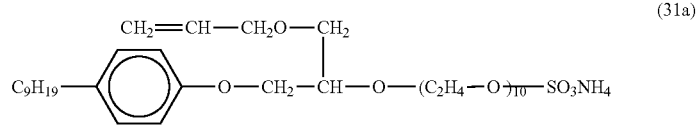

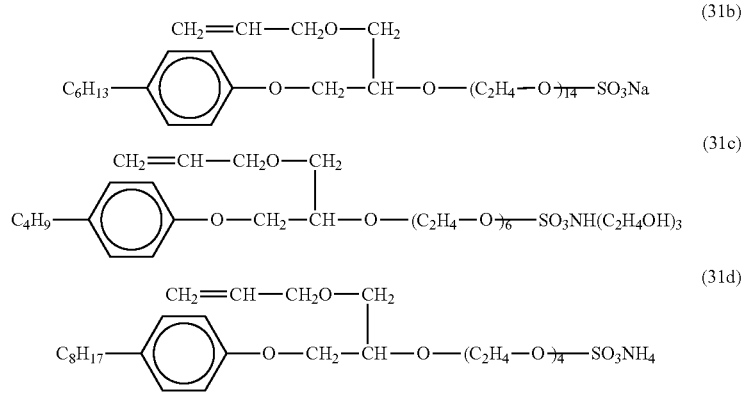

As the above-mentioned anionically polymerizable surfactants, commercially available products may be used. Examples thereof include Aqualon HS series (Aqualon HS-05, HS-10, HS-20 and HS-1025) manufactured by Daiichi Kogyo Seiyaku Co., Ltd., and Adeka Reasoap SE-10N and SE-20N manufactured by Asahi Denka Co., Ltd. Adeka Reasoap SE-10N manufactured by Asahi Denka Co., Ltd. is a compound in which $M^1$ is $NH_4$, $R^{31}$ is $C_9H_{19}$ and m is 10 in the compound represented by formula (310). Adeka Reasoap SE-20N manufactured by Asahi Denka Co., Ltd. is a compound in which $M^1$ is $NH_4$, $R^{31}$ is $C_9H_{19}$ and m is 20 in the compound represented by formula (310).

Further, as the anionically polymerizable surfactant used in the invention, a preferred example is a compound represented by general formula (33):

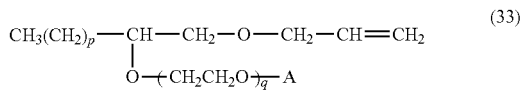

wherein p is 9 or 11; q is an integer of 2 to 20; and A is a group represented by $-SO_3M^3$, wherein $M^3$ is an alkali metal, an ammonium salt or an alkanolamine. Preferred examples of the anionically polymerizable surfactant represented by formula (33) include the following compound:

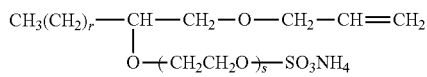

wherein r is 9 or 11; and s is 5 or 10.

As the above-described anionically polymerizable surfactant, commercially available products may be used. Examples thereof include Aqualon KH series (Aqualon KH-5 and Aqualon KH-10) manufactured by Daiichi Kogyo Seiyaku Co., Ltd. Aqualon KH-5 is a mixture of a compound in which r is 9 and s is 5, and a compound in which r is 11 and s is 5, in the compound represented by the above-mentioned formula. Aqualon KH-10 is a mixture of a compound in which r is 9 and s is 10, and a compound in which r is 11 and s is 10, in the compound represented by the above-mentioned formula.

Further, a compound represented by the following formula (A) is also preferred as the anionically polymerizable surfactant.

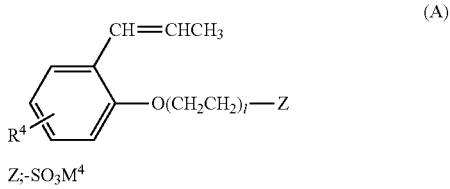

wherein $R^4$ represents a hydrogen atom or a hydrocarbon group having 1 to 12 carbon atoms; l represents a number of 2 to 20; and $M^4$ represents an alkali metal, an ammonium salt or an alkanolamine.

The anionically polymerizable surfactants shown above as examples can be used either alone or in combination of two or more of them.

The amount of the anionically polymerizable surfactant added is preferably within the range of about 1 to about 10 times the molarity of the cationically polymerizable surfactant, and more preferably within the range of about 1.0 to about 5 times the molarity thereof. By adjusting the amount added to 1 time the molarity or more, the dispersibility and dispersion stability of the encapsulated particles become excellent, and ejection stability also becomes excellent. By adjusting the amount added to 10 times the molarity or less, the occurrence of an anionically polymerizable surfactant that does not contribute to encapsulation can be inhibited, and the occurrence of a polymer particle having no core material other than the encapsulated particle can be prevented.

After microencapsulation, the anionic groups of the above-described anionically polymerizable surfactant seem to be present on the capsule surface in the state in which they are orientated toward the aqueous phase side. Thus, the dispersibility and dispersion stability of the encapsulated particles in the aqueous phase become excellent.

Preferred examples of the hydrophilic monomer having an anionic group that can be used in the invention include a monomer having at least an anionic group as a hydrophilic group and a polymerizable group in its structure, wherein the hydrophilic group is selected from the group consisting of a sulfonic acid group, a sulfinic acid group, a carboxyl group, a carbonyl group and salts of these groups. The polymerizable group is a radically polymerizable unsaturated hydrocarbon group, and preferably selected from the group consisting of a vinyl group, an allyl group, an acryloyl group, a methacryloyl group, a propenyl group, a vinylidene group and a vinylene group.

The anionic groups such as a sulfonic acid group, a sulfinic acid group, a carboxyl group, a carbonyl group and salts of these groups seem to be present on the capsule surface in the state in which they are orientated toward the aqueous phase side, and therefore the dispersibility and dispersion stability of the encapsulated particles in the aqueous phase become excellent. Preferred specific examples of the anionic group-containing hydrophilic monomers include, for example, methacrylic acid, acrylic acid, a phosphoric acid group-containing (meth)acrylate, sodium vinylsulfonate, 2-sulfoethyl methacrylate and 2-acrylamido-2-methylpropanesulfonic acid.

The amount of the hydrophilic monomer having an anionic group added is preferably within the range of about 1 to about 10 times the molarity of the cationically polymerizable surfactant, and more preferably within the range of about 1.0 to about 5 times the molarity thereof. By adjusting the amount added to 1 time the molarity or more, the dispersibility and dispersion stability of the encapsulated particles become excellent, and the ejection stability also becomes excellent. By adjusting the amount added to 10 times the molarity or less, the occurrence of a hydrophilic monomer that does not contribute to encapsulation can be inhibited, and the occurrence of a polymer particle having no core material other than the encapsulated particle can be prevented.

When the anionically polymerizable surfactant and the hydrophilic monomer having an anionic group are used together, the total amount added is preferably within the range of about 1 to about 10 times the molarity of the cationically polymerizable surfactant, and more preferably within the range of about 1.0 to about 5 times the molarity thereof. As described above, by adjusting the amount added to 1 time the molarity or more, the dispersibility and dispersion stability of the encapsulated particles become excellent. By adjusting the amount added to 10 times the molarity or less, the occurrence of a hydrophilic monomer that does not contribute to encapsulation can be inhibited, and the occurrence of a polymer particle having no core material other than the encapsulated particle can be prevented.

More specifically, the microencapsulated particulate metal material according to the embodiment of the invention is suitably produced by the following procedures.

(1) The cationically polymerizable surfactant is added to a dispersion in which the metal particles having an anionic group on their surfaces are dispersed in water. Here, the cationic group of the cationically polymerizable surfactant is adsorbed onto the anionic group of the metal particles having an anionic group on their surface to be ionically bonded thereto for immobilization.

(2) A comonomer copolymerizable with the cationically polymerizable surfactant, more specifically, the anionically polymerizable surfactant having an anionic group, a hydrophobic group and a polymerizable group and/or the hydrophilic monomer having an anionic group and a polymerization initiator are added to perform emulsion polymerization.

By such procedures, there can be suitably produced the microencapsulated particulate metal material coated with a polymer including a repeating structural unit derived from the cationically polymerizable surfactant and a repeating structural unit derived from the anionically polymerizable surfactant and/or the hydrophilic monomer having an anionic group.

Further, in order to control the storage stability of the ink, an additional comonomer may be added. Examples of the additional comonomer include a hydrophilic monomer (a hydrophilic monomer other than the above-mentioned hydrophilic monomer having an anionic group) and a hydrophobic monomer.

In general, when a solid polymer, particularly an amorphous solid polymer, is elevated in temperature from a low temperature to a high temperature, the phenomenon occurs that a state in which very large force is required for slight deformation (glass state) is rapidly changed into a state in which large deformation occurs by small force. The temperature at which this phenomenon occurs is called the glass transition point (or the glass transition temperature). Usually, in a differential thermal curve obtained by temperature rise measurement with a differential scanning calorimeter, the temperature at an intersection of a tangential line drawn from a bottom of an adsorption peak to an initiation point of adsorption and a base line is taken as the glass transition point. Further, it is known that other physical properties such as the elastic modulus, the specific heat and the refractive index also rapidly change at the glass transition point, and it is known that the glass transition point can also be determined by measuring these physical properties. In the invention, the glass transition point obtained by the temperature rise measurement with the differential scanning calorimeter (DSC) is used.

The glass transition point (Tg) of the copolymer with which the metal particles of the microencapsulated particulate metal material are coated is preferably 30° C. or lower, more preferably 15° C. or lower, and still more preferably 10° C. or lower. It is therefore preferred that the copolymer with which the metal particles of the microencapsulated particulate metal material are coated is designed so as to provide a glass transition point of 30° C. or lower. More preferably, the copolymer is designed so as to provide a glass transition point of 15° C. or lower, and still more preferably, 10° C. or lower. However, when the glass transition point is lower than −20° C., solvent resistance tends to decrease.

Such a glass transition point of the copolymer can be adjusted within the above-mentioned range by suitably selecting the kind and composition ratio of hydrophobic monomer used. When it is possible to heat the ejected matter at a temperature equal to or higher than the glass transition point (Tg) of the copolymer with which the metal particles of the microencapsulated particulate metal material are coated, the glass transition point may exceed 30° C., because film formation is possible at a glass transition point equal to or lower than the heating temperature. However, in this case, a heating mechanism is required to be attached to an ink jet recording apparatus, which causes the problem of increased cost of the apparatus. Accordingly, the glass transition point is preferably adjusted to 30° C. or lower.

Examples of the hydrophilic monomer other than the hydrophilic monomer having an anionic group include a monomer having a hydroxyl group, an ethylene oxide group, an amido group or an amino group as the hydrophilic group.

More specifically, examples of the hydrophilic monomers other than the hydrophilic monomer having an anionic group include: OH-group-containing monomers such as 2-hydroxyethyl methacrylate, 2-hydroxypropyl methacrylate and 2-hydroxybutyl methacrylate; ethylene oxide group-containing monomers such as ethyldiethylene glycol acrylate, polyethylene glycol monomethacrylate and methoxypolyethylene glycol methacrylate; amido group-containing monomers such as acrylamide and N,N-dimethylacrylamide; amino group-containing alkylamino esters of acrylic acid or methacrylic acid such as N-methylaminoethyl methacrylate, N-methylaminoethyl acrylate, dimethylaminoethyl methacrylate, dimethylaminoethyl acrylate, diethylaminoethyl methacrylate and diethylaminoethyl methacrylate; alkylamino group-containing unsaturated amides such as N-(2-dimethylaminoethyl)acrylamide, N-(2-dimethylaminoethyl)methacrylamide and N,N-dimethylaminopropylacrylamide; monovinylpyridines such as vinylpyridine; alkylamino group-containing vinyl ethers such as dimethylaminoethyl vinyl ether; vinylimidazole; and N-vinyl-2-pyrrolidone.

In this embodiment, the hydrophobic monomer can be suitably used. That is to say, in the microencapsulated particulate metal material according to an embodiment of the invention, the metal particles having an anionic group on their surfaces may further have a repeating structural unit derived from the hydrophobic monomer, in addition to a repeating structural unit derived from the cationically polymerizable surfactant having a cationic group, a hydrophobic group and a polymerizable group, and a repeating structural unit derived from the anionically polymerizable surfactant having an anionic group, a hydrophobic group and a polymerizable group and/or the hydrophilic monomer having an anionic group.

Examples of the hydrophobic monomer include a monomer having at least a hydrophobic group and a polymerizable group in its structure, wherein the hydrophobic group is selected from the group consisting of an aliphatic hydrocarbon group, an alicyclic hydrocarbon group and an aromatic hydrocarbon group. The aliphatic hydrocarbon groups include a methyl group, an ethyl group and a propyl group, the alicyclic hydrocarbon groups include a cyclohexyl group, a dicyclopentenyl group, a dicyclopentanyl group and an isobornyl group, and the aromatic hydrocarbon groups include a benzyl group, a phenyl group and a naphthyl group. The polymerizable group is a radically polymerizable unsaturated hydrocarbon group, and preferably selected from the group consisting of a vinyl group, an allyl group, an acryloyl group, a methacryloyl group, a propenyl group, a vinylidene group and a vinylene group.

Specific examples of the hydrophobic monomers include: styrene and styrene derivatives such as methylstyrene, dimethylstyrene, chlorostyrene, dichlorostyrene, bromostyrene, p-chloromethylstyrene and divinylbenzene; monofunctional acrylic esters such as methyl acrylate, ethyl acrylate, n-butyl acrylate, butoxyethyl acrylate, benzyl acrylate, phenyl acrylate, phenoxyethyl acrylate, cyclohexyl acrylate, dicyclopentanyl acrylate, dicyclopentenyl acrylate, dicyclopentenyloxyethyl acrylate, tetrahydrofurfuryl acrylate and isobornyl acrylate; monofunctional methacrylic esters such as methyl methacrylate, ethyl methacrylate, n-butyl methacrylate, 2-ethylhexyl methacrylate, butoxymethyl methacrylate, benzyl methacrylate, phenyl methacrylate, phenoxyethyl methacrylate, cyclohexyl methacrylate, dicyclopentanyl methacrylate, dicyclopentenyl methacrylate, dicyclopentenyloxyethyl methacrylate, tetrahydrofurfuryl methacrylate and isobornyl methacrylate; allyl compounds such as allylbenzene, allyl-3-cyclohexane propionate, 1-allyl-3,4-dimethoxybenzene, allyl phenoxyacetate, allyl phenylacetate, allylcyclohexane and an allyl multivalent carboxylate; esters of fumaric acid, maleic acid and itaconic acid; and radically polymerizable group-containing monomers such as an N-substituted maleimide and a cyclic olefin.

As the hydrophobic monomer, one satisfying the above-mentioned required characteristics is appropriately selected, and the amount thereof added is arbitrarily determined.

Further, it is also preferred that the polymer with which the metal particles are coated further has a repeating structural unit derived from a crosslinkable monomer. When the polymer has a repeating structural unit derived from the crosslinkable monomer, a crosslinked structure is formed in the polymer, which can improve solvent resistance (the characteristic that the solvent contained in the ink jet ink is difficult to penetrate into the polymer with which the metal particles are coated). When the solvent penetrates into the polymer with which the metal particles are coated, the polymer is swelled or deformed to disturb the orientation state of the anionic groups of the metal particles that are orientated toward the aqueous medium side, which possibly results in deterioration in the dispersion stability of the microencapsulated particulate metal material. In such a case, forming the crosslinked structure in the polymer with which the metal particles are coated improves the solvent resistance of the microencapsulated particulate metal material, resulting in more excellent dispersion stability in the ink jet ink in which the water-soluble organic solvent is also present.

The crosslinkable monomer that can be used in the invention is a compound having two or more of unsaturated hydrocarbon groups of at least one kind selected from the group consisting of a vinyl group, an allyl group, an acryloyl group, a methacryloyl group, a propenyl group, a vinylidene group and a vinylene group. Examples thereof include ethylene glycol diacrylate, diethylene glycol diacrylate, triethylene glycol diacrylate, tetraethylene glycol diacrylate, polyethylene glycol diacrylate, allyl acrylate, bis(acryloxyethyl)hydroxyethyl isocyanurate, bis(acryloxyneopentyl glycol)adipate, 1,3-butylene glycol diacrylate, 1,6-hexanediol diacrylate, neopentyl glycol diacrylate, propylene glycol diacrylate, polypropylene glycol diacrylate, 2-hydroxy-1,3-diacryloxy-propane, 2,2-bis[4-(acryloxy)phenyl]propane, 2,2-bis[4-(acryloxyethoxy)phenyl]propane, 2,2-bis[4-(acryloxyethoxy-diethoxy)phenyl]propane, 2,2-bis[4-(acryloxyethoxy-polyethoxy)phenyl]propane, hydroxypivalic acid neopentyl glycol diacrylate, 1,4-butanediol diacrylate, dicyclopentanyl diacrylate, dipentaerythritol hexaacrylate, dipentaerythritol monohydroxypentaacrylate, ditrimethylolpropane tetraacrylate, pentaerythritol triacrylate, tetrabromobisphenol A diacrylate, triglycerol diacrylate, trimethylolpropane triacrylate, tris(acryloxyethyl)isocyanurate, ethylene glycol dimethacrylate, diethylene glycol dimethacrylate, triethylene glycol dimethacrylate, tetraethylene glycol dimethacrylate, polyethylene glycol dimethacrylate, propylene glycol dimethacrylate, polypropylene glycol dimethacrylate, 1,3-butylene glycol dimethacrylate, 1,4-butanediol dimethacrylate, 1,6-hexanediol dimethacrylate, neopentyl glycol dimethacrylate, 2-hydroxy-1,3-dimethacryloxypropane, 2,2-bis[4-(methacryloxy)phenyl]propane, 2,2-bis[4-(methacryloxy-ethoxy)phenyl]propane, 2,2-bis[4-(methacryloxyethoxy-diethoxy)phenyl]propane, 2,2-bis[4-(methacryloxyethoxy-polyethoxy)phenyl]propane, tetrabromobisphenol A dimethacrylate, dicyclopentanyl dimethacrylate, dipentaerythritol hexamethacrylate, glycerol dimethacrylate, hydroxypivalic acid neopentyl glycol dimethacrylate, dipentaerythritol mono-hydroxypentamethacrylate, ditrimethylolpropane tetramethacrylate, pentaerythritol trimethacrylate, pentaerythritol tetramethacrylate, triglycerol dimethacrylate, trimethylol-propane trimethacrylate, tris(methacryloxyethyl)iso-cyanurate, allyl methacrylate, divinylbenzene, diallyl phthalate, diallyl terephthalate, diallyl isophthalate and diethylene glycol bis-allylcarbonate.

In addition, it is preferred that the polymer with which the metal particles are coated further has repeating structural units derived from a monomer represented by the following general formula (1):

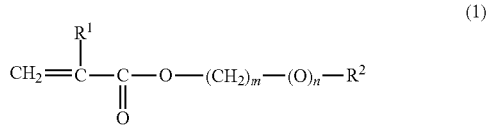

(1)

wherein $R^1$ represents a hydrogen atom or a methyl group, $R^2$ represents a t-butyl group, an alicyclic hydrocarbon group, an aromatic hydrocarbon group or a heterocyclic group, m represents an integer of 0 to 3, and n represents an integer of 0 or 1.

The above-mentioned $R^2$ group, which is a "bulky" group derived from the monomer represented by general formula (1), contained in the polymer decreases the flexibility of the polymer molecules, that is to say, restrains the mobility of the molecules. Accordingly, the mechanical strength and heat resistance of the polymer are improved, so that the use of the ink using the microencapsulated particulate metal material of this embodiment coated with the polymer can provide a coated product, such as metal wiring, having excellent abrasion resistance and durability. Further, the presence of the above-mentioned $R^2$ group, which is the "bulky" group, in the polymer can inhibit penetration of the organic solvent into the polymer, so that the microencapsulated particulate metal material of this embodiment becomes excellent in solvent resistance, and can provide stabler ejection properties, dispersibility and long-term storage stability can be obtained in an ink jet ink in which the water-soluble organic solvent is also present.

In the above-mentioned general formula (1), the alicyclic hydrocarbon groups represented by $R^2$ include a cycloalkyl group, a cycloalkenyl group, an isobornyl group, a dicyclopentanyl group, a dicyclopentenyl group, an adamantane group and a tetrahydrofuran group.

As described above, the polymer including repeating a structural unit derived from the crosslinkable monomer and the polymer including a repeating structural unit derived from the monomer represented by general formula (1) have the advantages of having a high Tg and excellent mechanical strength, heat resistance and solvent resistance. However, when used as an ink jet ink for metal wiring, the microencapsulated particulate metal material coated with such a polymer becomes insufficient in plasticity of the polymer, which is likely to cause poor adhesion to the substrate. As a result, the fixability and abrasion resistance of the microencapsulated particulate metal material to the substrate may be reduced in some cases.

On the other hand, the polymer including a repeating structural unit derived from a monomer having a long-chain alkyl group, of the above-mentioned hydrophobic monomers, has flexibility. Accordingly, the polymer having mechanical strength and solvent resistance of such a degree that the plasticity is not impaired can be obtained by adjusting the ratio of repeating structural units derived from the crosslinkable monomer and/or repeating structural units derived from the monomer represented by general formula (1) to repeating structural units derived from the monomer having a long-chain alkyl group. The microencapsulated particulate metal material coated with such a polymer can easily adhere to the substrate, so that it is excellent in fixability and also in solvent resistance. Accordingly, the ink using this microencapsulated particulate metal material can provide excellent ejection stability, dispersion stability and long-term storage stability, also in the ink jet ink in which the water-soluble organic solvent coexists. Further, the use of the ink using this microencapsulated particulate metal material can provide a coated product, such as metal wiring, that is good in adhesion to the substrate and excellent in abrasion resistance, durability and solvent resistance.

Furthermore, specific examples of the monomers represented by the above-mentioned general formula (1) include the following:

Isobonyl Methacrylate

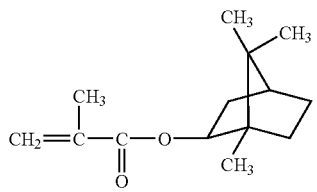

Weather resistance Homopolymer        Tg 155° C. (180° C.)

Isobonyl Acrylate

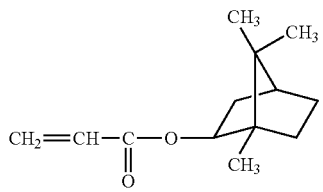

Weather resistance Homopolymer        Tg 94° C.

Dicyclopentenyl Acrylate

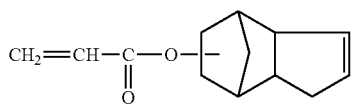

Imparting adhesion to acrylic resin Homopolymer        Tg 120° C.

Dicyclopentenyl Methacrylate

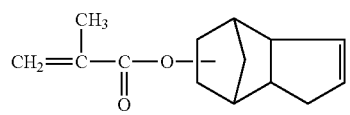

Chemical resistance

Dicyclopentenyloxyethyl Acrylate

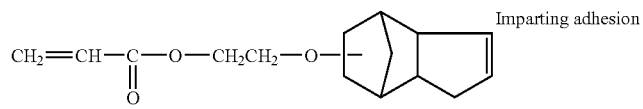

Imparting adhesion

Dicyclopentanyl Acrylate

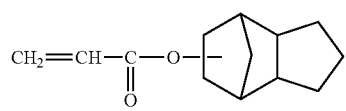

Low hygroscopicity
Weather resistance
Homopolymer  Tg 120° C.

Dicyclopentenyloxyethyl Methacrylate

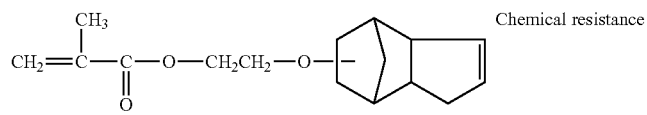

Chemical resistance

Dicyclopentanyl Methacrylate

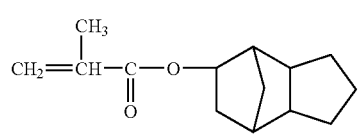

Low hygroscopicity
Weather resistance
Homopolymer  Tg 175° C.

t-Butyl Methacrylate

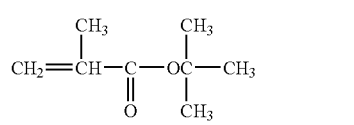

Homopolymer  Tg 107° C.

Benzyl Methacrylate

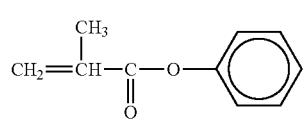

Homopolymer  Tg 54° C.

Cyclohexyl Methacrylate

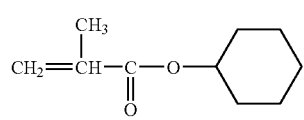

Homopolymer  Tg 66° C.

Tetrahydrofurfuryl Methacrylate

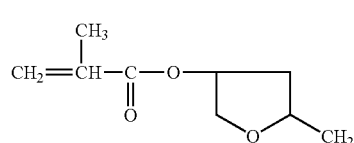

Homopolymer  Tg 60° C.

Preferably, copolymerization of the cationically polymerizable surfactant with the anionically polymerizable surfactant and/or the hydrophilic monomer having an anionic group, or further, copolymerization with, in addition to these, the hydrophobic monomer, the crosslinkable monomer or the monomer represented by the above-mentioned general formula (1) is initiated by addition of the polymerization initiator. As such a polymerization initiator, preferred is a water-soluble polymerization initiator, and examples thereof include potassium persulfate, ammonium persulfate, sodium persulfate, 2,2-azobis(2-methylpropionamidine)dihydrochloride and 4,4-azobis(4-cyanovaleric acid).

Then, the microencapsulated particulate metal material according to the embodiment of the invention can be suitably produced by adding the above-mentioned cationically polymerizable surfactant to the aqueous dispersion of the metal particles having an anionic group as the hydrophilic group on their surfaces, adding water or water and the aqueous solvent as needed, followed by mixing, performing irradiation with an ultrasonic wave for a specified period of time, then, adding the anionically polymerizable surfactant and/or the hydrophilic monomer having an anionic group (in addition to these, the above-mentioned hydrophobic monomer, crosslinkable monomer or monomer represented by general formula (1) may be added), adding water as needed, performing irradiation with an ultrasonic wave again for a specified period of time to achieve dispersion, elevating the temperature to a specified temperature (a temperature at which the polymerization initiator is activated) while performing ultrasonic wave irradiation and stirring, adding the polymerization initiator, and activating the polymerization initiator to perform emulsion polymerization.

More specifically, when the above-mentioned hydrophobic monomer is used, the microencapsulated particulate metal material can be more suitably produced by a production method including: adding the cationically polymerizable surfactant having a cationic group, a hydrophobic group and a polymerizable group to an aqueous dispersion of the metal particles having an anionic group on their surfaces, followed by mixing and treatment by irradiation with an ultrasonic wave; adding the hydrophobic monomer, followed by mixing; adding the anionically polymerizable surfactant having an anionic group, a hydrophobic group and a polymerizable group and/or the hydrophilic monomer having an anionic group, followed by mixing and treatment by irradiation with an ultrasonic wave; and adding the polymerization initiator to perform emulsion polymerization, wherein these processes are carried out in this order.

More specifically, when the above-mentioned crosslinkable monomer and/or the monomer represented by general formula (1) is used, the microencapsulated particulate metal material can be more suitably produced by a production method including: adding the cationically polymerizable surfactant having a cationic group, a hydrophobic group and a polymerizable group to an aqueous dispersion of the metal particles having an anionic group on their surfaces, followed by mixing and treatment by irradiation with an ultrasonic wave; adding the crosslinkable monomer and/or the monomer represented by general formula (1), followed by mixing; adding the anionically polymerizable surfactant having an anionic group, a hydrophobic group and a polymerizable group and/or the hydrophilic monomer having an anionic group, followed by mixing and treatment by irradiation with an ultrasonic wave; and adding the polymerization initiator to perform emulsion polymerization, wherein these processes are carried out in this order.

More specifically, when the above-mentioned crosslinkable monomer and/or the monomer represented by general formula (1) is used, the encapsulated particulate metal material can be more suitably produced by a production method including: adding the cationically polymerizable surfactant having a cationic group, a hydrophobic group and a polymerizable group to an aqueous dispersion of the metal particles having an anionic group on their surfaces, followed by mixing and treatment by irradiation with an ultrasonic wave; adding the crosslinkable monomer and/or the monomer represented by general formula (1) and the monomer having a long-chain alkyl group, followed by mixing; adding the anionically polymerizable surfactant having an anionic group, a hydrophilic group and a polymerizable group and/or the hydrophilic monomer having an anionic group, followed by mixing and treatment by irradiation with an ultrasonic wave; and adding the polymerization initiator to perform emulsion polymerization, wherein these processes are carried out in this order.

With the emulsion polymerization according to the invention, the cationically polymerizable surfactant is first allowed to be adsorbed onto the hydrophilic group (in particular, the anionic group) on the surface of the metal particle having an anionic group on its surface, then, the hydrophobic monomer is added, and further, the anionically polymerizable surfactant and/or the hydrophilic monomer having an anionic group are added, followed by treatment by irradiation with an ultrasonic wave, thereby forming a state in which the form of arrangement of the polymerizable surfactants and monomer that are present around the metal particle is highly controlled and the anionic groups are orientated toward the aqueous phase in the outermost shell. Then, the monomer is converted to the polymer by emulsion polymerization, with this highly controlled form kept, thereby obtaining the microencapsulated particulate metal material according to the embodiment of the invention. With the above-mentioned process, the generation of water-soluble oligomers and polymers which are by-products can be decreased. This can reduce the viscosity of the dispersion of the resulting microencapsulated particulate metal material, and make easier a purification process such as ultrafiltration. An ink using such a microencapsulated particulate metal material is excellent in dispersion stability and ejection stability from an ink jet head.

For the polymerization reaction, a reaction vessel equipped with an ultrasonic generator, a stirrer, a reflux condenser, a dropping funnel, and a temperature controller is preferably used. The polymerization reaction is initiated by elevating the temperature of the water-soluble polymerization initiator added into the reaction system to the cleavage temperature thereof, thereby cleaving the polymerization initiator to generate an initiator radical, which attacks the unsaturated group of the polymerizable surfactant or the monomer. The polymerization initiator can be preferably added into the reaction system by adding dropwise an aqueous solution of the water-soluble polymerization initiator in pure water into the reaction vessel. The polymerization initiator in the reaction system can be suitably activated by elevating the temperature of the aqueous dispersion to a specified polymerization temperature. The polymerization temperature is preferably within the range of 60° C. to 90° C., and the polymerization time is preferably 3 hours to 10 hours. After completion of the polymerization, the pH is adjusted to within the range of 7.0 to 9.0, and then, filtration is preferably performed. The filtration is performed by ultrafiltration. When the metal particles having an anionic group as the hydrophilic groups on their surfaces are not in the state of an aqueous dispersion, they are preferably subjected to dispersion treatment as a pre-treatment using a commonly used dispersing device such as a ball mill, a roll mill, an Eiger mill or a jet mill.

In the microencapsulated particulate metal material thus obtained according to an embodiment of the invention, it seems that the metal particles having a small average particle size are completely coated with the polymer layer (without any defect portion), and that the hydrophilic groups of the polymer layer are regularly orientated toward the aqueous solvent (see FIGS. 2 and 4). Accordingly, the particulate metal material has high dispersion stability to the aqueous solvent.

The microencapsulated particulate metal material according to an embodiment of the invention is described above, where the particle size of the microencapsulated particulate metal material is preferably 400 nm or smaller, more preferably 300 nm or smaller, and particularly preferably 20 to 200 nm.

Aqueous Dispersion

The aqueous dispersion according to an embodiment of the invention contains the microencapsulated particulate metal material according to the embodiment of the invention, and a preferred example of such an aqueous dispersion is a liquid resulting from emulsion polymerization as carried out according to the above-mentioned embodiment of the invention. An ink jet ink according to an embodiment of the invention can be produced by further adding other components for obtaining the ink jet ink to the aqueous dispersion by an ordinary procedure.

The ink jet ink according to an embodiment of the invention is preferably produced by purifying this aqueous dispersion containing the microencapsulated particulate metal material. Other than the microencapsulated particulate metal material, this aqueous dispersion may contain unreacted materials derived from the monomers used: (a) cationically polymerizable surfactant; (b) hydrophobic monomer; and (c) anionically polymerizable surfactant and/or the hydrophilic monomer having an anionic group.

The concentration of unreacted (c) anionically polymerizable surfactant and/or hydrophilic monomer having an anionic group in the aqueous dispersion after the purification is preferably 50,000 ppm or lower, more preferably 10,000 ppm or lower based on the aqueous components. "Aqueous components" as mentioned herein refer to the components excluding water-insoluble components, such as the metal particles of the microencapsulated particulate metal material, contained in the aqueous dispersion, and include aqueous media, unreacted polymerizable surfactants and unreacted monomers, for example. In addition, the term "unreacted (c) anionically polymerizable surfactant and/or hydrophilic monomer" refers to compounds that have not contributed to formation of the coating polymer of the microencapsulated particulate metal material among (c) the anionically polymerizable surfactant and/or the hydrophilic monomer added. They include not only the anionically polymerizable surfactant and/or the hydrophilic monomer as monomers, but also oligomers and polymers formed by polymerization of the anionically polymerizable surfactant and/or the hydrophilic monomer.

Among the components constituting the coating polymer of the microencapsulated particulate metal material, particularly, (c) anionically polymerizable surfactant and/or the hydrophilic monomer having an anionic group is preferably added in excess in order to stabilize the encapsulated particles before the polymerization, as described above. When (c) is added in excess, the concentration of unreacted (c) in the aqueous dispersion after the polymerization tends to increase. Therefore, by controlling the concentration of unreacted (c), the above-described advantages are presumed to be more remarkable.

The total concentration of unreacted (a) and (c) after the above purification after the purification of the aqueous dispersion containing the microencapsulated particulate metal material is preferably 50,000 ppm or lower, more preferably 10,000 ppm or lower based on the aqueous components in the aqueous dispersion. When the microencapsulated particulate metal material is formed by adding (b) hydrophobic monomer in addition to the above-described polymerizable surfactants to perform polymerization, the total concentration of unreacted (a), (b) and (c) after the purification is preferably 50,000 ppm or lower, more preferably 10,000 ppm or lower based on the aqueous components in the aqueous dispersion. Here, the unreacted hydrophobic monomer seems to be solubilized by the unreacted polymerizable surfactants. In general, the concentrations of the unreacted materials before the purification are preferably in the range of 5 to 40% by weight for (a), in the range of 5 to 40% by weight for (b), and in the range of 5 to 40% by weight for (c), respectively, based on individual charged amounts.

As a method for purifying the aqueous dispersion containing the microencapsulated particulate metal material, centrifugation, ultrafiltration or the like may be used. Further, in the invention, the concentrations of the above (a), (b), and (c) in the aqueous dispersion can be measured by the following first method or second method.

First Method

In advance, spectroscopic properties of the cationically polymerizable surfactant, the anionically polymerizable surfactant, and the hydrophilic monomer having an anionic group dissolved in ion-exchanged water are measured with a spectrophotometer, and a calibration curve of each substance is prepared based on the dissolved amount thereof in ion-exchanged water and the absorbance at a characteristic absorption wavelength. Then, the obtained aqueous dispersion of the microencapsulated particulate metal material is subjected to centrifugation at 20,000 rpm for 30 minutes on a centrifugal machine and the resulting supernatant is diluted to a predetermined dilution rate (e.g., 100-fold). Absorbance of the diluted solution at 200 to 400 nm is measured with a spectrophotometer and the amount of each substance in the supernatant is determined based on the above calibration curve.

With regard to the hydrophobic monomer, in advance, spectroscopic property of the hydrophobic monomer dissolved in an organic solvent such as n-hexane is measured with a spectrophotometer, and a calibration curve thereof is prepared based on the dissolved amount in an organic solvent such as n-hexane and the absorbance at a characteristic absorption wavelength. Then, the obtained aqueous dispersion of the microencapsulated particulate metal material is mixed with an organic solvent such as n-hexane and the organic solvent phase is collected and diluted to a predetermined dilution rate. The absorbance of the diluted solution at 200 to 400 nm is measured with a spectrophotometer, and the amount of the hydrophobic monomer extracted into the organic solvent such as n-hexane is determined based on the above calibration curve.

Second Method

In advance, by liquid chromatography of the cationically polymerizable surfactant, the anionically polymerizable surfactant, and the hydrophilic monomer dissolved in ion-exchanged water, a calibration curve of each substance is prepared based on the dissolved amount in ion-exchanged water and retention time thereof. Then, the obtained aqueous dispersion of the microencapsulated particulate metal material is subjected to centrifugation at 20,000 rpm for 30 minutes on a centrifugal machine and the resulting supernatant is separated by liquid chromatography. The dissolved amount of each of the cationically polymerizable surfactant, the anionically polymerizable surfactant, and the hydrophilic monomer in the supernatant are determined based on the retention volume at each retention time of the cationically polymerizable surfactant, the anionically polymerizable surfactant, and the hydrophilic monomer and the above calibration curve.

With regard to the hydrophobic monomer, in advance, by liquid chromatography of the hydrophobic monomer dissolved in an organic solvent such as n-hexane, a calibration curve thereof is prepared based on the dissolved amount in an organic solvent such as n-hexane and retention time thereof. Then, the obtained aqueous dispersion of the microencapsulated particulate metal material is mixed with an organic solvent such as n-hexane and the organic solvent phase is collected, which is separated by liquid chromatography. The amount of the hydrophobic monomer extracted into the organic solvent such as n-hexane is determined based on retention volume at the retention time of the hydrophobic monomer and the above calibration curve.

Ink Jet Ink

The ink jet ink according to an embodiment of the invention contains the aqueous dispersion, as described above. Further, the ink jet ink according to another embodiment of the invention contains at least the microencapsulated particulate metal material according to the embodiment of the invention and water. The content of the microencapsulated particulate metal material is preferably 1 to 20% by weight, more preferably 3 to 15% by weight, based on the total weight of the ink jet ink. Particularly preferably, it is 5 to 15% by weight.

Further, the solvent for the ink jet ink according to the embodiment of the invention preferably contains water and a water-soluble organic solvent as basic solvents, and can contain any other components as needed.

Examples of the water-soluble organic solvents include an alkyl alcohol having 1 to 4 carbon atoms such as ethanol, methanol, butanol, propanol or isopropanol, a glycol ether such as ethylene glycol monomethyl ether, ethylene glycol monoethyl ether, ethylene glycol monobutyl ether, ethylene glycol monomethyl ether acetate, diethylene glycol monomethyl ether, diethylene glycol monoethyl ether, ethylene glycol mono-n-propyl ether, ethylene glycol mono-iso-propyl ether, diethylene glycol mono-iso-propyl ether, ethylene glycol mono-n-butyl ether, diethylene glycol mono-n-butyl ether, triethylene glycol mono-n-butyl ether, ethylene glycol mono-t-butyl ether, diethylene glycol mono-t-butyl ether, 1-methyl-1-methoxybutanol, propylene glycol monomethyl ether, propylene glycol monoethyl ether, propylene glycol mono-t-butyl ether, propylene glycol mono-n-propyl ether, propylene glycol mono-iso-propyl ether, dipropylene glycol monomethyl ether, dipropylene glycol monoethyl ether, dipropylene glycol mono-n-propyl ether, dipropylene glycol mono-iso-propyl ether, propylene glycol mono-n-butyl ether or dipropylene glycol mono-n-butyl ether, formamide, acetamide, dimethylsulfoxide, sorbit, sorbitan, acetin, diacetin, triacetin and sulfolane.

Further, the ink jet ink according to the embodiment of the invention preferably contains a wetting agent made of a high boiling water-soluble organic solvent as a water-soluble organic solvent, in order to impart water retentivity and wettability to the ink jet ink. Examples of such a high boiling water-soluble organic solvent include a high boiling water-soluble organic solvent having a boiling point of 180° C. or higher.

Specific examples of the water-soluble organic solvents having a boiling point of 180° C. or higher include ethylene glycol, propylene glycol, diethylene glycol, pentamethylene glycol, trimethylene glycol, 2-butene-1,4-diol, 2-ethyl-1,3-hexanediol, 2-methyl-2,4-pentanediol, tripropylene glycol monomethyl ether, dipropylene glycol monoethyl glycol, dipropylene glycol monoethyl ether, dipropylene glycol monomethyl ether, dipropylene glycol, triethylene glycol monomethyl ether, tetraethylene glycol, triethylene glycol, diethylene glycol monobutyl ether, diethylene glycol monoethyl ether, diethylene glycol monomethyl ether, tripropylene glycol, polyethylene glycol having a molecular weight of 2,000 or less, 1,3-propylene glycol, isopropylene glycol, isobutylene glycol, 1,4-butanediol, 1,3-butanediol, 1,5-pentanediol, 1,6-hexanediol, glycerin, mesoerythritol and pentaerythritol. The organic solvent having a boiling point of 200° C. or higher is preferred. These can be used either alone or in combination of two or more of them. This can provide the ink jet ink that retains flowability and re-dispersibility for a long period of time even when it is allowed to stand in an open state (a state in which the ink is in contact with air at room temperature). Further, clogging of nozzles becomes difficult to occur during ejection or on restarting after the interruption of ejection, so that high ejection stability can be obtained.

The content of these water-soluble organic solvents is preferably about 10 to about 50% by weight, more preferably 10 to 30% by weight, based on the total weight of the ink jet ink.

Further, examples of the water-soluble organic solvents include polar solvents such as 2-pyrrolidone, N-methylpyrrolidone, ε-caprolactam, dimethyl sulfoxide, sulfolane, morpholine, N-ethylmorpholine and 1,3-dimethyl-2-imidazolidinone, and one or more of them may be selected for use. Addition of these polar solvents is effective for dispersibility, and can improve ejection stability of the ink. The content of these polar solvents is preferably 0.1 to 20% by weight, more preferably 1 to 10% by weight, based on the total weight of the ink jet ink.

It is preferred that the ink jet ink according to an embodiment of the invention contains a penetrant. As such a penetrant, an alkyl ether of a polyhydric alcohol (also referred to as a glycol ether) and a 1,2-alkyldiol may be preferably used. Specific examples of the alkyl ether of a polyhydric alcohol include ethylene glycol monomethyl ether, ethylene glycol monoethyl ether, ethylene glycol monobutyl ether, ethylene glycol monomethyl ether acetate, diethylene glycol monomethyl ether, diethylene glycol monoethyl ether, ethylene glycol mono-n-propyl ether, ethylene glycol mono-iso-propyl ether, diethylene glycol mono-iso-propyl ether, ethylene glycol mono-n-butyl ether, diethylene glycol mono-n-butyl ether, triethylene glycol mono-n-butyl ether, ethylene glycol mono-t-butyl ether, diethylene glycol mono-t-butyl ether, 1-methyl-1-methoxybutanol, propylene glycol monomethyl ether, propylene glycol monoethyl ether, propylene glycol mono-t-butyl ether, propylene glycol mono-n-propyl ether, propylene glycol mono-iso-propyl ether, dipropylene glycol monomethyl ether, dipropylene glycol monoethyl ether, dipropylene glycol mono-n-propyl ether, dipropylene glycol mono-iso-propyl ether, propylene glycol mono-n-butyl ether and dipropylene glycol mono-n-butyl ether. Specific examples of 1,2-alkyldiol include 1,2-pentanediol and 1,2-hexanediol. Besides these, the penetrant may be appropriately selected from diols of straight-chain hydrocarbons such as 1,3-propanediol, 1,4-butanediol, 1,5-pentanediol, 1,6-hexanediol, 1,7-heptanediol and 1,8-octanediol.

In an embodiment of the invention, propylene glycol monobutyl ether, dipropylene glycol monobutyl ether, diethylene glycol monobutyl ether, triethylene glycol monobutyl ether, 1,2-pentanediol and 1,2-hexanediol are particularly preferred. The total content of these penetrants is preferably 1 to 20% by weight, more preferably 1 to 10% by weight, based on the total weight of the ink jet ink.

In particular, in an embodiment of the invention, inclusion of glycerin can sufficiently ensure the clogging reliability and storage stability of the ink. Furthermore, at least one compound selected from the group consisting of an alkyl ether of a polyhydric alcohol and a 1,2-alkyldiol may be included.

Further, when the above-mentioned glycol ether is used, the glycol ether is preferably used in combination with the acetylene glycol compound, which will be described later, as a surfactant.

Further, it is preferred that the ink jet ink according to an embodiment of the invention contains a surfactant, particularly an anionic surfactant and/or a nonionic surfactant. Specific examples of the anionic surfactant include: sulfonic acid type surfactants such as an alkanesulfonate, an α-olefinsulfonate, an alkylbenzenesulfonate, an alkylnaphthalenesulfonic acid, an acylmethyltaurine acid and a dialkylsulfosuccinic acid; an alkylsulfuric ester salt, a sulfated oil, a sulfated olefin, a polyoxyethylene alkyl ether sulfuric ester salt; carboxylic acid type surfactants such as a fatty acid salt and an alkylsarcosine salt; and phosphoric ester type surfactants such as an alkylphosphoric ester salt, a polyoxyethylene alkyl ether phosphoric ester salt and a monoglyceride phosphoric ester salt. Further, specific examples of the nonionic surfactant include: ethylene oxide addition type surfactants such as a polyoxyethylene alkyl ether, a polyoxyethylene alkyl phenyl ether, a polyoxyethylene alkyl ester and a polyoxyethylene alkylamide; polyol ester type surfactants such as a glycerol alkyl ester, a sorbitan alkyl ester and a sugar alkyl ester; polyether type surfactants such as a polyhydric alcohol alkyl ether; and alkanolamide type surfactants such as an alkanolamine fatty acid amide.

More specifically, examples of the anionic surfactant include sodium dodecylbenzenesulfonate, sodium laurate and an ammonium salt of a polyoxyethylene alkyl ether sulfate. Specific examples of the nonionic surfactants include: ether surfactants such as polyoxyethylene nonyl phenyl ether, polyoxyethylene octyl phenyl ether, polyoxyethylene dodecyl phenyl ether, a polyoxyethylene alkyl allyl ether, polyoxyethylene oleyl ether, polyoxyethylene lauryl ether, a polyoxyethylene alkyl ether and a polyoxyalkylene alkyl ether; and ester surfactants such as polyoxyethylene oleic acid, polyoxyethylene oleic acid ester, polyoxyethylene distearic acid ester, sorbitan laurate, sorbitan monostearate, sorbitan monooleate, sorbitan sesquioleate, polyoxyethylene monooleate and polyoxyethylene stearate.

In particular, it is desirable that the ink jet ink according to an embodiment of the invention contains an acetylene glycol-based surfactant and/or an acetylene alcohol-based surfactant as the surfactant. This can enhance the dispersibility of the ink.

One preferred example of the acetylene glycol compound that can be used in the invention is a compound represented by the following formula (6):

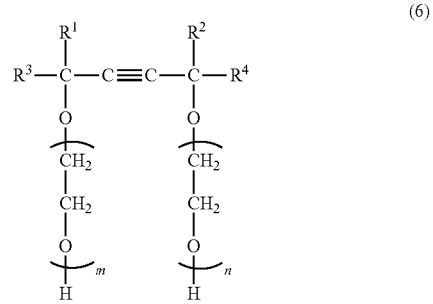

In formula (6) above, m and n each represent a number satisfying $0 \leqq m+n \leqq 50$. Further, $R^1$, $R^2$, $R^3$ and $R^4$ each independently represent an alkyl group (preferably an alkyl group having 6 or less carbon atoms). Among the compounds represented by formula (6) above, particularly preferred specific examples of the compound represented by the above-mentioned formula (6) include 2,4,7,9-tetramethyl-5-decyne-4,7-diol, 3,6-dimethyl-4-octyne-3,6-diol and 3,5-dimethyl-1-hexyne-3-ol. As the compound represented by formula (6) above, products commercially available as the acetylene glycol-based surfactants may be used. Specific examples thereof include Surfynol 104, 82, 465, 485 and TG (both available from Air Products and Chemicals, Inc.), and Olfine STG and Olfine E1010 ((product names) manufactured by Nissin Chemical Industry Co., Ltd.).

Examples of the acetylene alcohol-based surfactant include Surfynol 61 (available from Air Products and Chemicals, Inc.).

The content of these surfactants is preferably 0.01 to 10% by weight, more preferably 0.1 to 5% by weight, based on the total weight of the ink jet ink.

The ink jet ink according to an embodiment of the invention can further contain fine polymer particles. Such fine polymer particles are preferably the following particles 1) to 3):

1) Fine polymer particles having an anionic group on their surfaces, a glass transition temperature of 30° C. or lower and a volume average particle size of 10 to 200 nm.

2) Fine polymer particles having on their surfaces an anionic group that is the same as the anionic group on the surfaces of the metal particles of the microencapsulated particulate metal material according to the invention, a glass transition temperature of 30° C. or lower and a volume average particle size of 10 to 200 nm.

3) Fine polymer particles having an anionic group on their surfaces, a glass transition temperature of 30° C. or lower, a volume average particle size of 10 to 200 nm, and such a reactivity with a divalent metal salt that the time required for decreasing the transmittance of light at a wavelength of 700 nm to 50% of the initial value is $1 \times 10^4$ seconds or less when 3 volumes of a 0.1% by weight of an aqueous emulsion of the fine polymer particles is brought into contact with 1 volume of a 1 mol/L aqueous solution of the bivalent metal salt. In this case, the anionic group on the surfaces of the fine polymer particles may be the same or different from the anionic group on the surfaces of the metal particles of the microencapsulated particulate metal material.

As described above, the microencapsulated particulate metal material coated with the polymer including a repeating structural unit derived from the crosslinkable monomer and/or the polymer including a repeating structural unit derived from the monomer represented by general formula (1) has high mechanical strength, heat resistance and solvent resistance, but becomes insufficient in plasticity of the polymer, which tends to cause decreased fixability and abrasion resistance to the substrate when forming metal wiring. However, with the ink jet ink containing the microencapsulated particulate metal material coated with such a polymer insufficient in plasticity and the above-mentioned fine polymer particles, the microencapsulated particulate metal material can be coated with the fine polymer particles on the substrate, when the fine polymer particles have film forming properties. Accordingly, particularly when the polymer with which the metal particles are coated has the crosslinked structure and/or the "bulky" group, the ink jet ink can be obtained in which the advantages resulting from the above-mentioned crosslinked structure and/or "bulky" group are compatible with fixability and abrasion resistance.

The film forming properties as used herein means that when the fine polymer particles are dispersed in water to form an aqueous emulsion, a film of the polymer is formed with evaporation of the water component of this aqueous emulsion. The ink composition of the invention containing the fine polymer particles has the property that the film of the polymer is similarly formed with evaporation of the solvent components thereof. This film of the polymer can fix the microencapsulated particulate metal material in the ink more firmly to the surface of the substrate. This can realize metal wiring having more excellent abrasion resistance and water resistance.

In order to impart film forming properties to the above-mentioned fine polymer particles, the glass transition point of the polymer of the fine polymer particles is preferably 30° C. or lower, more preferably 15° C. or lower, and still more preferably 10° C. or lower. When the ink containing the fine polymer particles and using the microencapsulated particulate metal material of the invention is ejected onto the substrate, the metal particles of the microencapsulated particulate metal material of the invention come close to one another. Consequently, the fine polymer particles and/or the polymer coatings of the microencapsulated particulate metal material and/or the fine polymer particles and the polymer coatings of the microencapsulated particulate metal material are fusion bonded. This forms a film in the state in which the metal particles are included inside (encapsulated), so that the fixability and abrasion resistance to the substrate can be particularly improved. The fine polymer particles are preferably designed so that the polymer constituting them has a glass transition point of 30° C. or lower, more preferably 15° C. or lower, still more preferably 10° C. or lower. The glass transition point of the polymer can be adjusted within the above-mentioned range by appropriately selecting the kind and composition ratio of monomer used.

When matter ejected by ink jet can be heated at a temperature equal to or higher than the glass transition point of the polymer constituting the fine polymer particles, film formation is possible at a glass transition temperature equal to the heating temperature or lower. Therefore, the glass transition point may exceed 30° C. However, in this case, it is necessary, for example, to attach a heating mechanism to an ink jet apparatus, which causes the problem of increased cost of the apparatus. Accordingly, the glass transition point is preferably adjusted to 30° C. or lower.

There are also methods for determining the glass transition point of the polymer of the fine polymer particles from the elastic modulus, the specific heat, the refractive index and the like. In the invention, however, the glass transition point obtained by temperature rise measurement with a differential scanning calorimeter (DSC) is used. That is to say, in a differential thermal curve obtained by the temperature rise measurement with the differential scanning calorimeter, the temperature at an intersection of a tangential line drawn from a bottom of an adsorption peak to an initiation point of adsorption and a base line is taken as the glass transition point.

Further, according to a preferred embodiment of the invention, the fine polymer particles has a minimum film forming temperature of preferably equal to or lower than room temperature, more preferably 30° C. or lower, most preferably 10° C. or lower. This is because the film formation of the fine polymer particles is preferably performed at a temperature equal to or lower than room temperature. The minimum film forming temperature as used herein refers to a minimum temperature at which a transparent continuous film is formed when a polymer emulsion obtained by dispersing the fine polymer particles in water is thinly flow cast on a metal plate such as an aluminum plate and the temperature thereof is elevated. In the temperature region lower than the minimum film forming temperature, the polymer emulsion takes the form of white powder. Further, according to a preferred embodiment of the invention, the glass transition point of the fine polymer particles is preferably 30° C. or lower.

Further, since the above-described fine polymer particles have an anionic group on their surfaces, they will not aggregate even when they are coexistent with the microencapsulated particulate metal material of the invention in an ink, and thus can stably be dispersed. Moreover, the above-described fine polymer particles has such a reactivity with a divalent metal salt that the time required for decreasing the transmittance of light at a wavelength of 700 nm to 50% of the initial value is $1 \times 10^4$ seconds or less when 3 volumes of 0.1% by weight of an aqueous emulsion of the fine polymer particles is brought into contact with 1 volume of a 1 mol/L aqueous solution of the divalent metal salt. Therefore, the anionic group is present in a large amount on the surfaces of the fine polymer particles, which is advantageous in that the fine polymer particles have good dispersion stability when they are coexistent with the microencapsulated particulate metal material of the invention in the ink. Here, when the above-described time exceeds $1 \times 10^4$ seconds, the anionic group is present in a small amount on the surface of the fine polymer particles, so that the fine polymer particles tend to have poor dispersion stability when they are coexistent with the microencapsulated particulate metal material of the invention in an ink.

The time required for decreasing the transmittance of light at a wavelength of 700 nm to 50% of the initial value when the fine polymer particles are brought into to contact with a divalent metal salt is preferably $1 \times 10^3$ seconds or less, more preferably $1 \times 10^2$ seconds or less. When the fine polymer particles used in the embodiment of the invention come in contact with a divalent metal ion, they react with the divalent ion to produce suspended matter, thus reducing the transparency of the solution. The amount of this suspended matter produced is measured as the transmittance of light. Here, examples of the divalent metal ion include $Ca^{2+}$, $Cu^{2+}$, $Ni^{2+}$, $Mg^{2+}$, $Zn^{2+}$ and $Ba^2$, and examples of the negative ion forming a salt with these divalent ions include $Cl^-$, $NO^{3-}$, $I^-$, $Br^-$, $ClO^{3-}$ and $CH_3COO^-$.

Such a high reactivity seems to be attributed to the fact that the fine polymer particles have the anionic group in a relatively large amount on their surfaces. An ink containing fine polymer particles having the anionic group in a large amount on their surfaces and exhibiting a high reactivity as described above does not have an affinity for a nozzle plate of an ink jet head that has been subjected to a water repellent treatment. Accordingly, the ink will not wet the nozzle plate, and thus provides a significant advantage of being able to effectively prevent flight bending of ink droplets and ejection failure. Examples of the above-mentioned anionic group include a sulfonic acid group, a sulfinic acid group, a carboxyl group and a carbonyl group. Particularly, if the above-described anionic group is the same as the anionic group on the surface of the microencapsulated particulate metal material of the invention, then the above-described fine polymer particles and the microencapsulated particulate metal material of the invention are excellent in dispersion stability when they are coexistent with each other in the ink.

Furthermore, for the particle size of the above-mentioned fine polymer particles, it is preferred that the volume average particle size thereof is within the range of 50 to 200 nm. When the volume average particle size exceeds 200 nm, the ejection of the ink tends to easily become unstable. In addition, according to a preferred embodiment of the invention, it is preferred that an aqueous emulsion in which the fine polymer particles are dispersed in an aqueous medium at a concentration of 10% by weight has a contact angle on a Teflon (registered trade mark) plate of 70° or more. Further, it is preferred that an aqueous emulsion in which the fine polymer particles are dispersed in an aqueous medium at a concentration of 35% by weight has a surface tension of $40 \times 10^{-3}$ N/m (40 dyne/cm, 20° C.). Use of the fine polymer particles as described above can prevent flight bending and achieve good ink jet ejection.

Furthermore, use of fine polymer particles having an anionic group in a relatively large amount as described above realizes better abrasion resistance and better water resistance.

Further, because of high hydrophilicity on the surfaces of the fine polymer particles, an ink of the invention using such fine polymer particles has the advantage that excellent storage stability can be obtained without decreasing the performance of the microencapsulated particulate metal material of the invention.

According to a preferred embodiment of the invention, it is preferred that the fine polymer particles contain a structure derived from an anionic group-containing unsaturated vinyl monomer in an amount of 1 to 10% by weight, have a structure crosslinked with a crosslinkable monomer having two or more polymerizable double bonds, and contain a structure derived from a crosslinkable monomer in an amount of 0.2 to 4% by weight. By using a crosslinkable polymer three-dimensionally crosslinked by copolymerization of a crosslinkable monomer having two or more polymerizable double bonds, preferably three or more polymerizable double bonds in polymerization, the surface of a nozzle plate becomes more difficult to be wet, which allows flight bending to be more efficiently prevented, thereby making it possible to improve ejection stability even further.

Fine polymer particles of a single particle structure can be used in the invention. Fine particles of a core-shell structure formed by a core portion and a shell portion surrounding it can be used in the invention as well. The term "core-shell structure" as used in the invention means a form in which two or more polymers different in compositions are present in a particle in a phase separated state. Accordingly, it may be not only a form in which the core portion is completely coated with the shell portion, but also a form in which the core portion is partly coated. Further, the polymer of the shell portion may partly form a domain in the core particle. Furthermore, it may have a multilayer structure of three or more layers in which one or more layers different in composition are further contained between the core portion and the shell portion.

The fine polymer particles used in the invention can be obtained by known emulsion polymerization, that is, emulsion polymerization of an unsaturated vinyl monomer in water in which a polymerization initiator and an emulsifier are present.

The unsaturated vinyl monomers include an acrylic ester monomer, a methacrylic ester monomer, an aromatic vinyl monomer, a vinyl ester monomer, a vinyl cyan compound monomer, a halogenated monomer, an olefin monomer and a diene monomer, which are commonly used in emulsion polymerization. Specific examples thereof include: acrylic esters such as methyl acrylate, ethyl acrylate, isopropyl acrylate, n-butyl acrylate, isobutyl acrylate, n-amyl acrylate, isoamyl acrylate, n-hexyl acrylate, 2-ethylhexyl acrylate, octyl acrylate, decyl acrylate, dodecyl acrylate, octadecyl acrylate, cyclohexyl acrylate, phenyl acrylate, benzyl acrylate and glycidyl acrylate; methacrylic esters such as methyl methacrylate, ethyl methacrylate, isopropyl methacrylate, n-butyl methacrylate, isobutyl methacrylate, n-amyl methacrylate, isoamyl methacrylate, n-hexyl methacrylate, 2-ethylhexyl methacrylate, octyl methacrylate, decyl methacrylate, dodecyl methacrylate, octadecyl methacrylate, cyclohexyl methacrylate, phenyl methacrylate, benzyl methacrylate and glycidyl methacrylate; vinyl esters such as vinyl acetate; vinyl cyan compounds such as acrylonitrile and methacrylonitrile; halogenated monomers such as vinylidene chloride and vinyl chloride; aromatic vinyl monomers such as styrene, 2-methylstyrene, vinyltoluene, t-butylstyrene, chlorostyrene, vinylanisole and vinyl-naphthalene; dienes such as butadiene and chloroprene; and vinyl monomers such as vinyl ether, vinyl ketone and vinylpyrrolidone. Use of a carboxyl group-containing unsaturated vinyl monomer is essential for a monomer having no carboxyl group, and examples thereof include acrylic acid, methacrylic acid, itaconic acid, fumaric acid and maleic acid. Methacrylic acid is preferably used. Further, the emulsifiers usable include an anionic surfactant, a nonionic surfactant and a mixture thereof.

As described above, in the invention, it is preferred that the fine polymer particles have the structure in which a molecule derived from the above-mentioned monomer is crosslinked with the crosslinkable monomer having two or more polymerizable double bonds. Examples of the crosslinkable monomers having two or more polymerizable double bonds include: diacrylate compounds such as polyethylene glycol diacrylate, triethylene glycol diacrylate, 1,3-butylene glycol diacrylate, 1,6-butylene glycol diacrylate, 1,6-hexanediol diacrylate, neopentyl glycol diacrylate, 1,9-nonanediol diacrylate, polypropylene glycol diacrylate, 2,2'-bis(4-acryloxypropyloxyphenyl)propane and 2,2'-bis(4-acryloxydiethoxyphenyl)propane; triacrylate compounds such as trimethylolpropane triacrylate, trimethylolethane triacrylate and tetramethylolmethane triacrylate; tetraacrylate compounds such as ditrimethylol tetraacrylate, tetramethylolmethane tetraacrylate and pentaerythritol tetraacrylate; hexaacrylate compounds such as dipentaerythritol hexaacrylate; dimethacrylate compounds such as ethylene glycol dimethacrylate, diethylene glycol dimethacrylate, triethylene glycol dimethacrylate, polyethylene glycol dimethacrylate, 1,3-butylene glycol dimethacrylate, 1,4-butylene glycol dimethacrylate, 1,6-hexanediol dimethacrylate, neopentyl glycol dimethacrylate, dipropylene glycol dimethacrylate, polypropylene glycol dimethacrylate, polybutylene glycol dimethacrylate and 2,2'-bis(4-methacryloxydiethoxyphenyl) propane; trimethacrylate compounds such as trimethylolpropane trimethacrylate and trimethylolethane trimethacrylate; methylenebisacrylamide; and divinylbenzene.

Further, in addition to the above-mentioned monomer, an acrylamide or a hydroxyl group-containing monomer is preferably added. Examples of the acrylamide include acrylamide and N,N'-dimethylacrylamide. Examples of the hydroxyl group-containing monomer include 2-hydroxyethyl acrylate, 2-hydroxypropyl acrylate, 2-hydroxyethyl methacrylate and 2-hydroxypropyl methacrylate. These can be used either alone or in combination of two or more of them.

Furthermore, the fine polymer particles having the core-shell structure can be produced by known methods, generally by multistage emulsion polymerization and the like, including, for example, a method disclosed in JP-A-4-76004. Examples of unsaturated vinyl monomers used for polymerization include the same monomers as described above.

In addition, a polymerization initiator, a surfactant, a molecular weight regulator, a neutralizing agent and the like used in emulsion polymerization may also be used based on ordinary methods.

In the invention, the fine polymer particles may be mixed as a fine particle powder with other components of the ink jet ink, but it is preferred that the fine polymer particles are dispersed in an aqueous medium to form a polymer emulsion, followed by mixing with other components of the ink jet ink. The content of the fine polymer particles in the ink is preferably about 0.01 to about 10% by weight, more preferably about 0.01 to about 5% by weight.

Furthermore, according to another aspect of the invention, there are provided fine polymer particles and a polymer emulsion in which the fine polymer particles are dispersed in water that can be used for an ink jet ink. Use of the fine polymer particles and the polymer emulsion can provide an ink having good performance that can be favorably used for ink jet technology.

Further, the ink jet ink according to an embodiment of the invention may contain a pH adjuster. The pH of the ink is adjusted to preferably the range of 7 to 9, more preferably to the range of 7.5 to 8.5. Specifically, as the pH adjuster, preferred are potassium metals such as sodium hydroxide, potassium hydroxide, lithium hydroxide, sodium carbonate, sodium hydrogencarbonate, potassium carbonate, lithium carbonate, sodium phosphate, potassium phosphate, lithium phosphate, potassium dihydrogenphosphate, dipotassium hydrogen phosphate, sodium oxalate, potassium oxalate, lithium oxalate, sodium borate, sodium tetraborate, potassium hydrogenphthalate and potassium hydrogentartrate; ammonia; and amines such as methylamine, ethylamine, diethylamine, trimethylamine, triethylamine, tris(hydroxymethyl)aminomethane hydrochloride, triethanolamine, diethanolamine, diethylethanolamine, triisopropenolamine, butyldiethanolamine, morpholine and propanolamine. Among them, addition of an alkali hydroxide compound or an amine alcohol can improve dispersion stability of the metal particles in the ink.

The amount of the alkali hydroxide compound added is preferably 0.01 to 5% by weight, more preferably 0.05 to 3% by weight, based on the total amount of the ink. The amount of the amine alcohol added is preferably 0.1 to 10% by weight, more preferably 0.5 to 5% by weight, based on the total amount of the ink.

Further, for the purpose of mildewproofing, antisepsis or rust prevention, the ink jet ink according to an embodiment of the invention may contain benzoic acid, dichlorophene, hexachlorophene, sorbic acid, a p-hydroxybenzoic ester, ethylenediamine-tetraacetic acid (EDTA), sodium dehydroacetate, 1,2-benthiazoline-3-one (product name: Proxel XL manufactured by Avecia), 3,4-isothiazoline-3-one or 4,4-dimethyloxazolidine. Furthermore, for the purpose of preventing nozzles of an ink jet head from being dried, the ink jet ink according to the embodiment of the invention may contain urea, thiourea and/or ethylene urea.

The ink jet ink according to a particularly preferred embodiment of the invention contains at least (1) the microencapsulated particulate metal material according to the embodiment of the invention, (2) at least one compound (penetrant) selected from the group consisting of diethylene glycol monobutyl ether, triethylene glycol monobutyl ether and/or an 1,2-alkyldiol having 4 to 10 carbon atoms, (4) glycerin, and (5) water. Such an ink jet ink is particularly excellent in dispersion stability and ejection stability, which causes no clogging of the nozzles for a long period of time. Accordingly, stable printing is possible.

The ink jet ink according to another particularly preferred embodiment of the invention contains at least (1) the microencapsulated particulate metal material according to the embodiment of the invention, (2) at least one compound (penetrant) selected from the group consisting of diethylene glycol monobutyl ether, triethylene glycol monobutyl ether and/or an 1,2-alkyldiol having 4 to 10 carbon atoms, (3) the acetylene glycol-based surfactant and/or the acetylene alcohol-based surfactant, (4) glycerin, and (5) water. Such an ink jet ink is particularly excellent in dispersion stability and ejection stability, and causes no clogging of the nozzles for a long period of time, so that it can be stably ejected.

In general, in the case of dispersing metal particles, a dispersant such as a surfactant or a polymer dispersant is used. Such a dispersant is merely adsorbed on surfaces of metal particles, so that the dispersant usually tends to be detached from the surfaces of the metal particles by some kind of environmental factor. In contrast, according to the embodiment of the invention, the surfaces of the metal particles having a hydrophilic group thereon are completely encapsulated with a polymer coating or a crosslinked polymer coating, and the polymer coating or the crosslinked polymer coating surrounding the surfaces of the metal particles is extremely firmly fixed to the surfaces of the metal particles, as described above. Therefore, it seems that the dispersant is difficult to be detached from the surfaces of the metal particles.

More particularly, in an ink prepared by using a metal particle dispersion in which metal particles are dispersed with a dispersant such as a surfactant or a polymer dispersant, and adding the above-mentioned acetylene glycol-based surfactant and/or acetylene alcohol-based surfactant and diethylene glycol monobutyl ether, triethylene glycol monobutyl ether, propylene glycol monobutyl ether, dipropylene glycol monobutyl ether, 1,2-alkyldiol or the like, the dispersant tends to be easily detached from the surfaces of the metal particles by strong shear force applied when the ink is ejected through fine nozzles, which causes deteriorated dispersibility, resulting in unstable ejection.

In contrast, in the ink jet ink using the microencapsulated particulate metal material according to the embodiment of the invention, such a phenomenon is not observed at all, and the ink is stably ejected. Further, the metal particles are encapsulated with the polymer coating, so that good solvent resistance is obtained. Accordingly, acceleration of detachment from the metal particles due to the above-mentioned penetrant and swelling of the polymer become difficult to occur, thereby making it possible to maintain excellent dispersion stability over a long period of time.

Further, in an ink using a metal particle dispersion in which metal particles are dispersed with a dispersant such as a surfactant or a polymer dispersant, there is generally a tendency that the viscosity of the ink increases due to the dispersant dissolved in the solution without being adsorbed on the surfaces of the metal particles from the beginning of dispersion, or that the dispersant is detached from the metal particles with an elapse of time after dispersion, and the detached dispersant causes an increase in the viscosity of the ink. Therefore, the content of the metal particles is limited in many cases. In contrast, in the ink using the microencapsulated particulate metal material according to the embodiment of the invention, the metal particles are encapsulated with the polymer coating as described above, so that the polymer is difficult to be detached from the metal particles, which causes no increase in the viscosity of the ink. Accordingly, the ink has the advantage that it can be easily lowered in viscosity and thus can contain more metal particles.

In the particularly preferred embodiment of the invention described above, diethylene glycol monobutyl ether or triethylene glycol monobutyl ether of (2) above as the penetrant is added preferably in an amount of 10% by weight or less, more preferably in an amount of 0.5 to 5% by weight, based on the total weight of the ink composition. Diethylene glycol monobutyl ether and/or triethylene glycol monobutyl ether improves solubility of the acetylene glycol-based surfactant.

In the particularly preferred embodiment of the invention described above, the 1,2-alkylenediol having 4 to 10 carbon atoms of the above (2) as the penetrant is added preferably in an amount of 15% by weight or less based on the total weight of the ink composition. When 1,2-alkyldiol having 3 or less carbon atoms is used, sufficient penetrability cannot be obtained. The 1,2-alkyldiol having carbon atoms exceeding 15 is unfavorable because it becomes difficult to dissolve in water. When the amount added exceeds 15% by weight, it is unsuitable because a tendency to increase the viscosity appears. Specifically, 1,2-pentanediol or 1,2-hexanediol is preferably used as the 1,2-alkyldiol. These can be used alone or both can be used together. 1,2-pentanediol is preferably added in an amount ranging from 3 to 15% by weight. 1,2-hexanediol is preferably added in an amount ranging from 0.5 to 10% by weight.

Further, particularly, in the ink jet ink according to an embodiment of the invention, in order to enhance the characteristic that the clogging is difficult to be generated (clogging reliability), a solid wetting agent is preferably added in an amount of 3 to 20% by weight based on the total weight of the ink. In this specification, the solid wetting agent refers to a water-soluble substance which is solid at ordinary temperature (25° C. and has a water-retaining function. Preferred examples of the solid wetting agents include a saccharide, a sugar alcohol, a hyaluronate, trimethylolpropane and 1,2,6-hexanetriol. Examples of the saccharides include a monosaccharide, a disaccharide, an oligosaccharide (including a trisaccharide and a tetrasaccharide) and a polysaccharide. Preferred examples thereof include glucose, mannose, fructose, ribose, xylose, arabinose, galactose, aldonic acid, glucitol (sorbit), maltose, cellobiose, lactose, sucrose, trehalose and maltotriose. The term "polysaccharide" as used herein means a saccharide in its broad sense, and is used in the sense that it includes substances widely present in nature, such as alginic acid, x-cyclodextrin and cellulose. Further, derivatives of these saccharides include a reduced sugar of the above-mentioned saccharide (for example, a sugar alcohol represented by a general formula $HOCH_2(CHOH)_nCH_2OH$ (wherein n represents an integer of 2 to 5), an oxidized sugar (for example, an aldonic acid or a uronic acid), an amino acid and a thiosugar. In particular, a sugar alcohol is preferred, and specific examples thereof include maltitol, sorbitol and xylitol. As the hyaluronate, a product commercially available as a 1% aqueous solution of sodium hyaluronate (molecular weight: 350,000) may be used. These solid wetting agents are used either alone or in combination of two or more of them. Particularly preferred examples of the solid wetting agents are trimethylolpropane, 1,2,6-hexanetriol, a saccharide and a sugar alcohol.

Use of the solid wetting agent can restrain the evaporation of water by its water retaining function, so that the ink does not increase in viscosity in its flow paths or in the vicinities of nozzles, and a film is difficult to be formed, so that clogging is difficult to occur. Further, the above-mentioned solid wetting agent is chemically stable, so that it does not decompose in the ink and thus makes it possible to maintain the performance of the ink for a long period of time. Furthermore, even when the above-mentioned solid wetting agent is added to the ink, the ink does not wet a nozzle plate, so that it can be stably ejected. In particular, when trimethylolpropane, 1,2,6-hexanetriol, a saccharide and a sugar alcohol are used, the beneficial effect is obtained.

In the invention, when the above-mentioned solid wetting agents are used alone, the content thereof is preferably 3 to 20% by weight, more preferably 3 to 10% by weight, based on the total weight of the ink jet ink. When two or more of the solid wetting agents are used as a mixture, the total amount of two or more of them is preferably 3 to 20% by weight, more preferably 3 to 10% by weight, based on the total weight of the ink jet ink. When two or more of them are used as a mixture, preferred is a combination of one selected from the group consisting of a saccharide, a sugar alcohol and a hyaluronate and one selected from the group consisting of trimethylolpropane and 1,2,6-hexanetriol. This combination is preferred because an increase in the viscosity of the ink caused by addition can be restrained. When the content of the solid wetting agents is less than 3% by weight, a sufficient effect of improving clogging reliability cannot be obtained. On the other hand, when the content exceeds 20% by weight, the harmful effect tends to occur that the viscosity increases and thus stable ejection is difficult to be achieved.

In the particularly preferred embodiment of the invention described above, the acetylene glycol-based surfactant and/or the acetylene alcohol-based surfactant of (3) above is added preferably in an amount of 0.01 to 10% by weight, more preferably in an amount of 0.1 to 5% by weight, based on the total weight of the ink.

Although the ink jet inks according to the embodiments of the invention have been described above, the microencapsulated particulate metal material according to each embodiment of the invention contained as metal particles have the shape of a true sphere, so that flowability of the ink tends to becomes Newtonian, and the anionic groups on its surface seem to be regularly and densely orientated toward the aqueous medium side. Accordingly, electrostatic repulsion seems to be effectively generated. There can be therefore prepared an jet ink that is more excellent in ejection stability, more excellent in dispersibility (high dispersibility) and dispersion stability, and is improved in the concentration of the metal particles contained, compared to the conventional microencapsulated particulate metal materials.

The ink jetting can be suitably achieved by loading a known ink jet apparatus with the ink jet ink according to the embodiment of the invention, and ejecting the ink onto a substrate for forming metal wiring of electronic equipment. This allows ejection stability of the ink from an ink jet head to be excellent, and can provide good metal wiring that is excellent in adhesion to the substrate of the metal wiring.

The invention has been described taking, as a preferred embodiment, the microencapsulated particulate metal material including metal particles having an anionic group on their surfaces and being coated with a polymer, and the polymer includes a repeating structural unit derived from a cationically polymerizable surfactant having a cationic group, a hydrophobic group and a polymerizable group. However, the invention may be, for example, a microencapsulated particulate metal material including metal particles having a cationic group, such as ammonium salt, on their surface and being coated with a polymer, and the polymer includes a repeating structural unit derived from an anionically polymerizable surfactant having at least an anionic group, a hydrophobic group and a polymerizable group. Such a microencapsulated particulate metal material constituted by the metal particles having a cationic group on their surfaces can also be obtained by a method similar to the production method of the microencapsulated particulate metal material constituted by the metal particles having an anionic groups on their surfaces according to the above-described embodiment, and can achieve similar effects to those of the above-described aqueous dispersion and ink jet ink.

Hereinafter, the invention will be described in a greater detail by way of examples and comparative examples, but the invention is not limited to the following examples.

Production of Metal Particles Having an Anionic Group on their Surfaces: Fine Silver Particles "P1"

1. First Step

To 1000 ml of a 50 mmol/L aqueous silver nitrate solution, 3.0 g of mercaptoacetic acid was added as a low molecular weight sulfur compound under stirring, and then the pH of the aqueous solution was adjusted to 10.0 with aqueous ammonia (26%). To this aqueous solution, 50 ml of a 400 mmol/L aqueous sodium borohydride solution as a reducing agent was rapidly added at room temperature to perform reduction, thereby producing fine silver particles having mercaptoacetic acid on their surfaces in the solution.

2. Second Step

The pH of the solution obtained in the first step was adjusted to 3.0 with nitric acid (20%), and the fine silver particles were allowed to settle. Then, the fine silver particles were separated with a vacuum filter, and washed with water until the electrical conductivity of the filtrate was reduced to 10.0 μS/cm or lower, thus obtaining a wet cake of the fine silver particles.

3. Third Step

The wet cake of the fine silver particles separated by filtration in the second step was added to water so that its concentration was 10%, and the pH of the solution was adjusted to 9.0 under stirring with aqueous ammonia (26%) to re-disperse the wet cake, thus obtaining a fine silver particle dispersion having mercaptoacetic acid on the surfaces of the particles.

Production of Fine Silver Particles "P2" Having an Anionic Group on their Surfaces A fine silver particle solution having 3-mercaptopropionic acid on the surfaces of the particles was obtained in the same manner as described above, except that 3.0 g of 3-mercaptopropionic acid was used in place of the mercaptoacetic acid used as the low molecular weight sulfur compound in the first step of producing the fine silver particles having mercaptoacetic acid on their surfaces of the particles used for the above-described fine silver particles "P1".

Production of Microencapsulated Fine Silver Particles "MCP1"

To an aqueous dispersion obtained by dispersing 15 g of the fine silver particles "P1" having an anionic group on their surfaces in 80 g of ion-exchanged water, 0.4 g of dimethylaminoethyl methacrylate methyl chloride was added as a cationically polymerizable surfactant and the whole was mixed, followed by irradiation with an ultrasonic wave for 15 minutes. Subsequently, 2.1 g of an anionically polymerizable surfactant, Aqualon KH-10, and 20 g of ion exchanged water were added thereto, followed by mixing and irradiation with an ultrasonic wave again for 30 minutes. The resulting mixture was charged into a reaction vessel equipped with a stirrer, a reflux condenser, a dropping funnel, a temperature controller, a nitrogen-introducing pipe and an ultrasonic generator. After the internal temperature of the reaction vessel was elevated to 80° C., an aqueous potassium persulfate solution obtained by dissolving 0.03 g of potassium persulfate as a polymerization initiator in 10 g of ion exchanged water was added dropwise, and polymerization was allowed to proceed at 80° C. for 6 hours under introduction of nitrogen. After completion of the polymerization, the mixture was adjusted to a pH of 8 with a 2 mol/L aqueous potassium hydroxide solution and filtered through a membrane filter having a pore size of 1 μm to remove coarse particles, thereby obtaining a dispersion of desired microencapsulated fine silver particles "MCP1".

The volume average particle size of the resulting dispersion was measured with a laser doppler system size distribution analyzer, Microtrac UPAL 50, manufactured by Leads & Northlop Co. As a result, it was 100 nm. The resulting dispersion was diluted 100 times with ion exchanged water, and pretreated. Then, the aspect ratio and the Zingg index were determined by observing the particles under a scanning electron microscope and measuring the major and minor diameters and thickness of the particles. As a result, the aspect ratio was 1.0, and the Zingg index was 1.0.

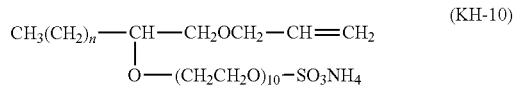
(KH-10)

Production of Microencapsulated Fine Silver Particles "MCP2"

To an aqueous dispersion obtained by dispersing 20 g of fine silver particles "P2" having an anionic group on their surfaces in 100 g of ion-exchanged water, 7.9 g of dimethylaminoethyl methacrylate benzyl chloride was added as a cationically polymerizable surfactant and the whole was mixed, followed by irradiation with an ultrasonic wave for 15 minutes. Subsequently, 24.4 g of an anionically polymerizable surfactant, Adeka Reasoap SE-10N and 20 g of ion exchanged water were added thereto, and the whole was mixed, followed by irradiation with an ultrasonic wave again for 30 minutes. The resulting mixture was charged into a reaction vessel equipped with a stirrer, a reflux condenser, a dropping funnel, a temperature controller, a nitrogen-introducing pipe and an ultrasonic generator. After the internal temperature of the reaction vessel was elevated to 80° C., an aqueous potassium persulfate solution obtained by dissolving 1.0 g of potassium persulfate as a polymerization initiator in 30 g of ion exchanged water was added dropwise, and polymerization was allowed to proceed at 80° C. for 6 hours under introduction of nitrogen. After completion of the polymerization, the mixture was adjusted to a pH of 8 with a 2 mol/L aqueous potassium hydroxide solution and filtered through a membrane filter having a pore size of 1 μm to remove coarse particles, thereby obtaining a dispersion of desired microencapsulated fine silver particles "MCP2".

The volume average particle size of the resulting dispersion was measured with a laser doppler system size distribution analyzer, Microtrac UPA150, manufactured by Leads &

Northlop Co. As a result, it was 150 nm. The resulting dispersion was diluted 100 times with ion exchanged water, and pretreated. Then, the aspect ratio and the Zingg index were determined by observing the particles under a scanning electron microscope and measuring the major and minor diameters and thickness of the particles. As a result, the aspect ratio was 1.0, and the Zingg index was 1.0.

Production of "Fine Polymer Particles 1"

A reaction vessel equipped with a stirrer, a reflux condenser, a dropping device and a temperature indicator was charged with 90 g of ion exchanged water and 1 g of an anionically polymerizable surfactant, Aqualon KH-5, and the temperature thereof was elevated to 70° C. under stirring while purging with nitrogen. The internal temperature was maintained at 70° C., and 2 g of potassium persulfate was added as a polymerization initiator and dissolved. Then, an emulsion previously obtained by stirring 1 g of an anionically polymerizable surfactant, Aqualon KH-5, 43.5 g of styrene, 47.5 g of n-butyl acrylate, 0.3 g of diethylene glycol dimethacrylate and 5 g of 2-acrylamido-2-methylpropanesulfonic acid in 45 g of ion exchanged water was continuously added dropwise into the reaction vessel over 3 hours. After completion of the dropwise addition, the reaction was further continued for 3 hours. After the resulting polymer emulsion was cooled to ordinary temperature, ion exchanged water and a 2 mol/L aqueous potassium hydroxide solution were added to adjust the solid content to 35% by weight and the pH to 8. The concentration of fine polymer particles in the resulting polymer emulsion was adjusted to 0.1% by weight, and 3 volumes thereof was allowed to contact with 1 volume of a 1 mol/L aqueous magnesium nitrate solution in a cell of a U-3300 spectrophotometer (manufactured by Hitachi, Ltd.). The time required for decreasing the transmittance at a wavelength of 700 nm to 50% of the initial value was 80 seconds. Further, the volume average particle size of the resulting dispersion was measured with a laser doppler system size distribution analyzer, Microtrac UPA150, manufactured by Leads & Northlop Co. As a result, it was 100 nm.

Furthermore, the resulting polymer emulsion was dried at room temperature, and the glass transition temperature thereof was measured with a DSC200 thermal scanning calorimeter (differential scanning calorimeter: DSC) manufactured by Seiko Denshi Co., Ltd. As a result, it was 3° C. The minimum film forming temperature was 15° C. The concentration of fine polymer particles in the resulting polymer emulsion was adjusted to 10% by weight, and the contact angle thereof on a Teflon (registered trade mark) plate was measured. As a result, it was 89°. In addition, the surface tension of the resulting polymer was measured with a CBVP-Z surface tension meter (manufactured by Kyowa Interface Science Co., Ltd.). As a result, it was $57 \times 10^{-3}$ N/m (57 dyne/cm).

Production of Ink Jet Ink: Metal Particle Ink 1

The ink jet ink 1 was prepared based on compositions shown below.

| Composition | Amount added |
|---|---|
| Microencapsulated fine silver particles: MCP | 18% by weight (solid concentration) |
| Wetting agent: Glycerin | 15% by weight |
| Solid wetting agent: Trimethylolpropane | 5% by weight |
| Polar solvent: 2-Pyrrolidone | 2% by weight |
| pH adjuster: Potassium hydroxide | 0.1% by weight |

-continued

| Composition | Amount added |
|---|---|
| Preservative: Proxel XL-2 | 0.05% by weight |
| Water: Ion exchanged water | Balance. |

Production of Ink Jet Ink: Metal Particle Ink 2

The ink jet ink 2 was prepared based on the compositions shown below.

| Composition | Amount added |
|---|---|
| Microencapsulated fine silver particles: MCP2 | 5% by weight (solid concentration) |
| Fine polymer particles: Fine polymer particles 1 | 3% by weight |
| Wetting agent: Glycerin | 13% by weight |
| Penetrant: Diethylene glycol monobutyl ether | 5% by weight |
| 1,2-Hexanediol | 3% by weight |
| Solid wetting agent: Trimethylolpropane | 7% by weight |
| Surfactant: Olfine E1010 | 1% by weight |
| pH Adjuster: Potassium hydroxide | 0.1% by weight |
| Preservative: Proxel XL-2 | 0.05% by weight |
| Water: Ion exchanged water | Balance |

Production of Ink Jet Ink: Metal Particle Ink 3

The ink jet ink 3 was prepared in the same manner as in the preparation of the ink jet ink 1, except that the fine silver particles having mercaptoacetic acid on the surfaces of the particles (in a state before introduction of the anionic groups on the surfaces), obtained in the above-described step of producing the metal particles, were used in place of the microencapsulated fine silver particles: MCP1 in the preparation of the ink jet ink 1.

Evaluation

The ink jet ink 1 (Example 1), the ink jet ink 2 (Example 2) and the ink jet ink 3 (Comparative Example 1), as well as conductive films formed using these inks were evaluated as follows.

Evaluation 1-1: Dispersibility 1

Each of the ink jet inks of the examples and the comparative example, the storage modulus (Pa) at each angular speed at the time when the angular speed was applied from 0.5 rad/sec to 5 rad/sec was measured at 20° C. with a rheometer, a Physica MCR300 manufactured by Paar Physica using a corn plate (CP 75-1 manufactured by Paar Physica) having a corn radius of 37.50 mm, a corn angle of 1° and a measuring gap of 0.05 mm. The storage modulus at 0.6 rad/sec was taken as $G'_{\omega=0.6}$, and the storage modulus at 0.8 rad/sec was taken as $G'_{\omega=0.8}$. The dispersibility of the ink was evaluated according to the following criteria:

A: The value of $(\log G'_{\omega=0.8} - \log G'_{\omega=0.6})/(\log 0.8 - \log 0.6)$ is 1.8 to 2.0.

B: The value of $(\log G'_{\omega=0.8} - \log G'_{\omega=0.6})/(\log 0.8 - \log 0.6)$ is 1.6 to 1.8.

C: The value of $(\log G'_{\omega=0.8} - \log G'_{\omega=0.6})/(\log 0.8 - \log 0.6)$ is 1.2 to 1.6.

D: The value of $(\log G'_{\omega=0.8} - \log G'_{\omega=0.6})/(\log 0.8 - \log 0.6)$ is less than 1.2.

Evaluation 1-2: Dispersibility 2

For each of the ink jet inks of the examples and the comparative example, the viscosity at angles of inclination of 70°, 60°, 50°, 4° and 30° was measured with a rolling ball viscometer AMVn at 20° C. using a capillary having an inner diameter of 0.9 mm and a steel ball having a diameter of 0.794 mm and a density of 7.850 g/cm³. The sin θ was plotted as abscissa and the viscosity as ordinate. The slope of the resulting sin θ-viscosity curve was determined, and the dispersibility of the ink was evaluated according to the following criteria:

A: The slope of the sin θ-viscosity curve is 0 to −0.05, and the ink indicates Newtonian properties and exhibits particularly good dispersibility.

B: The slope of the sin θ-viscosity curve is −0.05 to −0.1, and the ink indicates nearly Newtonian properties and exhibits good dispersibility next to that of A.

C: The slope of the sin θ-viscosity curve is −0.1 to −0.15, and the ink indicates non-Newtonian properties, but exhibits somewhat good dispersibility.

D: The slope of the sin θ-viscosity curve is less than −0.15, and the ink indicates non-Newtonian properties, easily settles and exhibits poor dispersibility.

Evaluation 2: Dispersion Stability

Each of the ink jet inks of the examples and the comparative example was put into a glass sample bottle, sealed, and then, allowed to stand at 60° C. for 2 weeks. The viscosity of the ink before and after the standing was examined. The viscosity was measured at 20° C. at a shear rate of 150 S⁻¹ with a rheometer, a Physica MCR300 manufactured by Paar Physica using a corn plate (CP 75-1 manufactured by Paar Physica) having a corn radius of 37.50 mm, a corn angle of 10 and a measuring gap of 0.05 mm. The results thus obtained were evaluated according to the following criteria:

A: The change is less than ±0.1 mPa·s.

B: The change is ±0.1 or more and less than 0.3 mPa·s.

C: The change is ±0.3 mPa·s or more.

Evaluation 3: Settling Properties

For each of the ink jet inks of the examples and the comparative example, the settling properties of the metal particles in the ink were measured at 20° C. using a TURBISCAN 2000 (manufactured by FORMUL ACTION) that can evaluate the settling properties from intensity distributions of back scattered light and transmitted light in the height direction of a sample. The measurement principle of the TURBISCAN 2000 instrument manufactured by FORMUL ACTION is as follows. This instrument has the mechanism that when a glass tube into which an ink is put is set at a specified position of the instrument and a measurement is started, a stage disposed surrounding the periphery (radial direction) of the glass tube vertically moves along the glass tube. A light source and detectors for scattered light and transmitted light installed on the stage measure the intensity distributions of scattered light and transmitted light at 40 μm intervals in the longitudinal direction of the glass tube, in response to the vertical movement of the stage. This operation is repeated at arbitrary time intervals so that any movement of particles or change in particle diameter can be observed as the intensity of light with time.

The evaluation was made according to the following criteria:

A: No settling phenomenon was observed even after 2 weeks.

B Settling phenomenon was observed after 2 weeks.

Evaluation 4: Ejection Stability

An ink jet apparatus, a PM-720C (manufactured by Seiko Epson Corporation), was loaded with each of the ink jet recording inks of the examples and the comparative example, and 1-mm ruled lines (silver conductive films) were formed on a substrate. The state of ejection such as dot missing and deviation in an ink landing position was visually observed, and evaluated according to the following criteria:

A: Neither dot missing nor deviation in the ink landing position occurs even when 10,000 or more ejections are carried out.

B: Dot missing or deviation in the ink landing position occurs when 1,000 to less than 10,000 ejections are carried out.

C: Dot missing or deviation in the ink landing position occurs when 100 to less than 1,000 ejections are carried out.

D: Dot missing or deviation in the ink landing position occurs when less than 100 ejections are carried out.

Evaluation 5: Clogging Reliability

After the ejection in the above-mentioned evaluation 4 was carried out a number of times that it is performed usually, a power supply of the inkjet apparatus was turned off, and the ink was allowed to stand. After one week, the same ejection test was conducted. The "state of ink ejection" at that time was visually observed, and evaluated according to the following criteria:

A: Normal ejection starts upon transmission of ejection signals to the ink jet apparatus, without requiring a cleaning operation.

B: Normal ejection is conducted after three or less cleaning operations.

C: Normal ejection is conducted after six or less cleaning operations.

D: Normal ejection can not be performed even after seven or more repeated cleaning operations.

Example 3

Formation of Conductive Films Using Ink Jet Ink

The fine silver particle containing ink jet ink 1 was ejected onto a glass substrate that had been subjected to a liquid repellency treatment at predetermined dot intervals using an ink jet apparatus to form conductive film lines. The dot interval was changed only by adjusting the ejection frequency, with the stage moving velocity kept constant. As the ink jet head, the head of a commercially available printer (product name "MJ930C") was used. However, the ink suction portion of the head was made of plastic, and therefore the suction port was changed to a metal jig so that it would not be dissolved in the organic solvent.

The liquid repellency treatment of the substrate was conducted as follows. First, as a pre-treatment, the glass substrate was cleaned by irradiation of ultraviolet light having a wavelength of 172 nm with 10 mW for 10 minutes. Then, in order to form a liquid-repellent and self-organizing film on the entire surface of the glass substrate, the glass substrate and 0.5 ml of tridecafluoro-1,1,2,2-tetrahydrooctyltriethoxysilane were placed in the same well-closed container, and stood still for 48 hours at room temperature, thereby forming a self-organizing film having fluoroalkyl groups on its surface on the glass substrate. The contact angle of the fine silver particle ink 1 on the substrate after the treatment was approximately 60°.

The dependency on the ejection voltage of the diameter of the ink jet ejection droplets of the fine silver particle ink 1 on the glass substrate subjected to a liquid repellency treatment in the above-described manner was as shown in Table 1.

TABLE 1

| | Ejection voltage (V) | | | | | |
|---|---|---|---|---|---|---|
| | 15 | 16 | 17 | 18 | 19 | 20 |
| Dot diameter (μm) | 58 | 64 | 66 | 67 | 70 | 72 |

The diameter of the droplets on the substrate was 72 μm in the ejection with an ejection voltage of 20 V. Further, the volume of the ink jet droplets was approximately 25 pl at an ejection voltage of 20 V, and the diameter of the droplets before landing on the substrate was 36 μm.

Figure 5:
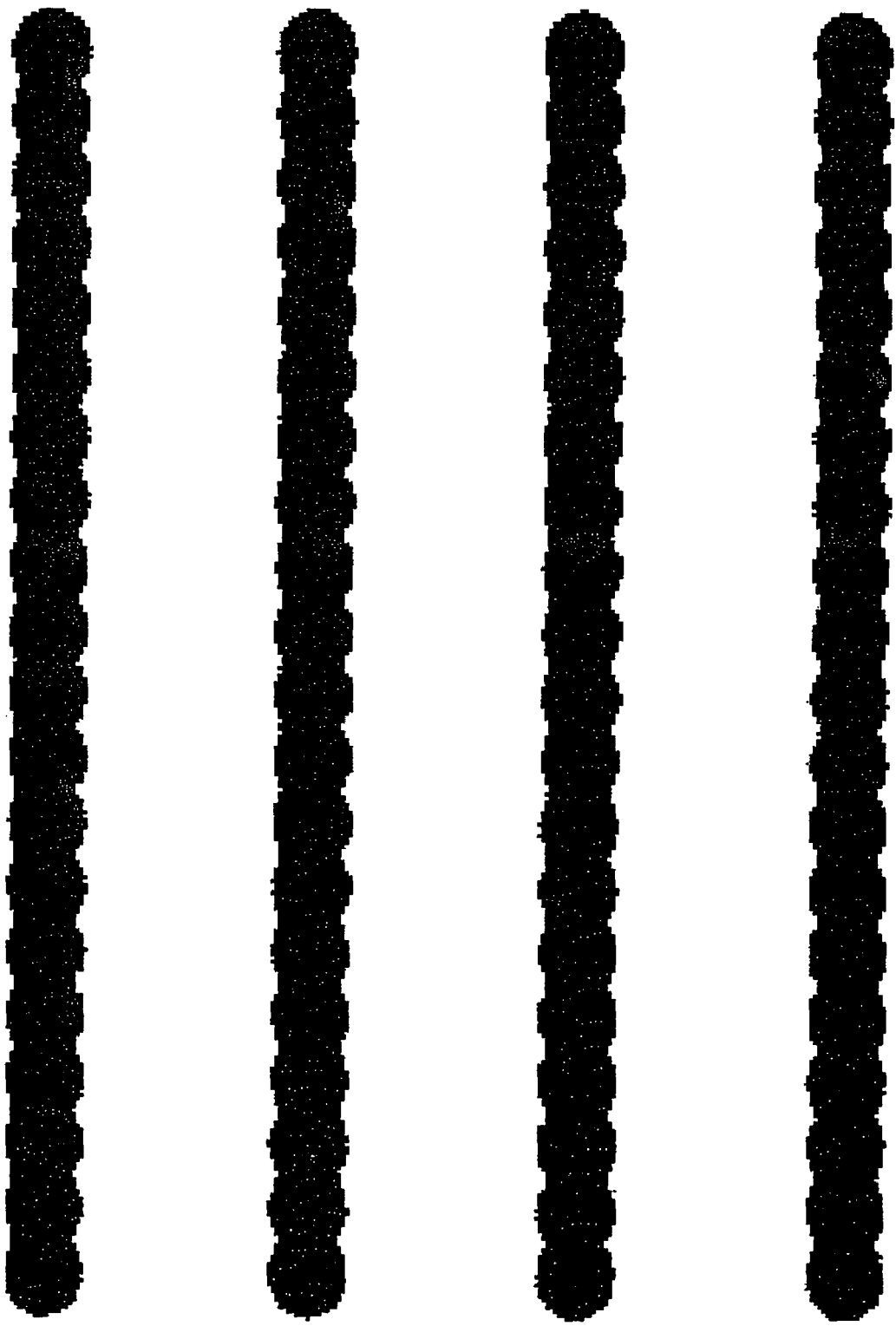
FIG. 5 is a plan view schematically showing conductive film wiring that is a pattern of films formed in an example of the invention.

When the line formation was performed by conducting ejection with an ejection voltage of 20 V at a dot interval of 70 μm, that is, a dot interval at which the overlap between the droplets on the substrate was 2 μm (about 3% of the dot diameter on the substrate), lines as shown in FIG. 5 were formed which were in a wave shape in which the dot form still remained, but were stable without any irregularities.

This substrate was heat-treated with a hot plate at 300° C. for 30 minutes to obtain a silver line having a thickness of 0.5 μm. The resistivity of the silver wire was approximately 5 μΩcm.

Example 4

Formation of Conductive Film Using Ink Jet Ink

After forming a self-organizing film in the method described in Example 3, the same ink and ink jet apparatus as those in Examples 3 were used to form conductive film lines on a substrate whose liquid repellency had been reduced by irradiation of ultraviolet light.

More specifically, after a self-organizing film was formed in the same manner as in Example 3, lines were formed on a substrate that had been irradiated with ultraviolet light with 10 mW/cm$^2$ for 5 minutes. Since the amount of the self-organizing film removed was small, the substrate after the irradiation of ultraviolet light had a certain degree of liquid repellency, and the contact angle of the fine silver particle ink 1 on the substrate was approximately 30°. The diameter of the droplets on this substrate was 150 μm in the ejection with an ejection voltage of 20 V. When the line formation was performed by conducting ejection at a dot interval of 135 μm, that is, a dot interval at which the overlap between the droplets on the substrate was 15 μm (10% of the dot diameter on the substrate), lines were formed which had a larger width than the lines formed in Example 3, but were stable and had the shape of a straight line, rather than a wave shape as shown in FIG. 5.

The invention has an industrial applicability as a microencapsulated particulate metal material for which aggregation of the metal particles has been suppressed by controlling elusion of the ions of the metal particles into a solvent and that has long-term storage stability, a method for producing the same, and an aqueous dispersion using the same, and an ink jet ink capable of improving the adhesion of the metal particles to the surface of a substrate by using a resin as a dispersant for coating the metal particles.

What is claimed is:

1. A microencapsulated particulate metal material comprising metal particles, a polymer coating the metal particles, and an ionic group provided on a surface of the polymer;
    wherein the metal particles have a thiol compound on surfaces of the metal particles.

2. A microencapsulated particulate metal material comprising metal particles having an anionic group on surfaces thereof and being coated with a polymer, the polymer including a repeating structural unit derived from a cationically polymerizable surfactant having a cationic group, a hydrophobic group and a polymerizable group;
    wherein the metal particles have a thiol compound on surfaces of the metal particles.

3. A microencapsulated particulate metal material comprising metal particles having an anionic group on surfaces thereof and being coated with a polymer by polymerizing a cationically polymerizable surfactant having a cationic group, a hydrophobic group and a polymerizable group in an aqueous dispersion in which the metal particles are dispersed;
    wherein the metal particles have a thiol compound on surfaces of the metal particles.

4. A microencapsulated particulate metal material comprising metal particles having an anionic group on surfaces thereof and being coated with a polymer, the polymer including a repeating structural unit derived from a cationically polymerizable surfactant having a cationic group, a hydrophobic group and a polymerizable group, and a repeating structural unit derived from an anionically polymerizable surfactant having a anionic group, a hydrophobic group and a polymerizable group and/or a hydrophilic monomer having an anionic group;
    wherein the metal particles have a thiol compound on surfaces of the metal particles.

5. A microencapsulated particulate metal material comprising metal particles having an anionic group on surfaces thereof and being coated with a polymer by polymerizing a cationically polymerizable surfactant having a cationic group, a hydrophobic group and a polymerizable group and an anionically polymerizable surfactant having an anionic group, a hydrophobic group and a polymerizable group and/or a hydrophilic monomer having an anionic group in an aqueous dispersion in which the metal particles are dispersed;
    wherein the metal particles have a thiol compound on surfaces of the metal particles.

6. The microencapsulated particulate metal material according to claim 2, wherein the polymer further includes a repeating structural unit derived from a hydrophobic monomer.

7. The microencapsulated particulate metal material according to claim 2, wherein the polymer further includes a repeating structural unit derived from a crosslinkable monomer and/or a repeating structural unit derived from a monomer represented by the following general formula (1):

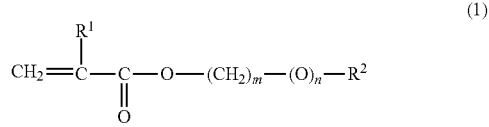

wherein $R^1$ represents a hydrogen atom or a methyl group, $R^2$ represents a t-butyl group, an alicyclic hydrocarbon group, an aromatic hydrocarbon group or a heterocyclic group, m represents an integer of 0 to 3, and n represents an integer of 0 or 1.

8. The microencapsulated particulate metal material according to claim 1, wherein the metal constituting the metal particles is at least one selected from the group consisting of gold, silver, platinum, palladium and copper.

9. The microencapsulated particulate metal material according to claim 2, wherein the anionic group of the metal particles is a carboxylic acid anion group (—COO$^-$).

10. The microencapsulated particulate metal material according to claim 2, wherein the anionic group of the metal particles is one selected from the group consisting of a sulfonic acid anion group (—SO$^{3-}$) and/or a sulfinic acid anion group (—RSO$^{2-}$: R represents an alkyl group having 1 to 12 carbon atoms, a phenylene group, or a modified group thereof).

11. The microencapsulated particulate metal material according to claim 2, wherein the cationic group of the cationically polymerizable surfactant is one selected from the group consisting of a primary amine cation, a secondary amine cation, a tertiary amine cation and a quaternary ammonium cation.

12. The microencapsulated particulate metal material according to claim 2, wherein the hydrophobic group of the cationically polymerizable surfactant is one selected from the group consisting of an alkyl group, an aryl group and a combined group thereof.

13. The microencapsulated particulate metal material according to claim 2, wherein the polymerizable group of the cationically polymerizable surfactant is a radically polymerizable unsaturated hydrocarbon group selected from the group consisting of a vinyl group, an allyl group, an acryloyl group, a methacryloyl group, a propenyl group, a vinylidene group and a vinylene group.

14. An aqueous dispersion comprising the microencapsulated particulate metal material according to claim 1.

15. An ink jet ink comprising the aqueous dispersion according to claim 14.

16. The ink jet ink according to claim 15, which is produced by purification treatment of the aqueous dispersion, wherein the concentration of unreacted anionically polymerizable surfactant and/or hydrophilic monomer having an anionic group after the purification treatment is 50,000 ppm or lower based on the aqueous component in the aqueous dispersion.

17. The ink jet ink according to claim 15, which is produced by purification treatment of the aqueous dispersion, wherein the total concentration of unreacted anionically polymerizable surfactant and/or hydrophilic monomer having an anionic group, and unreacted hydrophobic monomer after the purification treatment is 50,000 ppm or lower based on the aqueous component in the aqueous dispersion.

18. The ink jet ink according to claim 15, which is produced by purification treatment of the aqueous dispersion, wherein the total concentration of unreacted cationically polymerizable surfactant, unreacted anionically polymerizable surfactant and/or hydrophilic monomer having an anionic group, and unreacted hydrophobic monomer after the purification treatment is 50,000 ppm or lower based on the aqueous component in the aqueous dispersion.

19. The ink jet ink according to claim 18, wherein each of the concentrations of unreacted cationically polymerizable surfactant, unreacted anionically polymerizable surfactant and/or hydrophilic monomer having an anionic group, and unreacted hydrophobic monomer before the purification treatment is 5 to 40% by weight based on individual charged amounts.

20. An ink jet ink comprising at least the microencapsulated particulate metal material according to claim 1 and water.

21. The ink jet ink according to claim 15, further comprising fine polymer particles having an anionic group on their surfaces, a glass transition temperature of 30° C. or lower and a volume average particle size of 10 to 200 nm.

22. The ink jet ink according to claim 21, wherein the anionic group on the surfaces of the fine polymer particles is the same as the anionic group on the surfaces of the metal particles of the microencapsulated particulate metal material.

23. The ink jet ink according to claim 21, wherein the fine polymer particles have such a reactivity with a divalent metal salt that the time required for decreasing the transmittance of light at a wavelength of 700 nm to 50% of the initial value is 1×10$^4$ seconds or less when 3 volumes of a 0.1% by weight of an aqueous emulsion thereof is brought into contact with 1 volume of a 1 mol/L aqueous solution of the divalent metal salt.

24. The ink jet ink according to claim 15, further comprising a water-soluble organic solvent.

25. The ink jet ink according to claim 24, wherein the water-soluble organic solvent is a high boiling water-soluble organic solvent having a boiling point of 180° or higher.

26. The ink jet ink according to claim 24, wherein the water-soluble organic solvent is glycerin.

27. The ink jet ink according to claim 24, wherein the water-soluble organic solvent is at least one compound selected from the group consisting of an alkyl ether of a polyhydric alcohol and 1,2-alkyldiol.

28. The ink jet ink according to claim 15, further comprising a solid wetting agent in an amount of 3% by weight to 20% by weight based on the total weight of the ink jet ink.

29. The ink jet ink according to claim 28, wherein the solid wetting agent is at least one compound selected from the group consisting of trimethylolpropane, 1,2,6-hexanetriol, a saccharide and a sugar alcohol.

30. The microencapsulated particulate metal material according to claim 1, wherein the thiol compound is selected from mercaptoacetic acid, mercaptopropionic acid and mercaptoethanol.

* * * * *